US012805269B2

(12) United States Patent
Takeuchi et al.

(10) Patent No.: US 12,805,269 B2
(45) Date of Patent: Nov. 17, 2026

(54) SEMICONDUCTOR DEVICE

(71) Applicant: SONY SEMICONDUCTOR SOLUTIONS CORPORATION, Kanagawa (JP)

(72) Inventors: Keita Takeuchi, Kanagawa (JP); Satoshi Yamamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 508 days.

(21) Appl. No.: 18/551,251

(22) PCT Filed: Jan. 13, 2022

(86) PCT No.: PCT/JP2022/000888
§ 371 (c)(1),
(2) Date: Sep. 19, 2023

(87) PCT Pub. No.: WO2022/209128
PCT Pub. Date: Oct. 6, 2022

(65) Prior Publication Data

US 2024/0178079 A1 May 30, 2024

(30) Foreign Application Priority Data

Mar. 29, 2021 (JP) ................................ 2021-054562

(51) Int. Cl.
*H10F 39/00* (2025.01)
*H10F 39/12* (2025.01)
*H10P 74/00* (2026.01)

(52) U.S. Cl.
CPC ......... *H10P 74/273* (2026.01); *H10F 39/026* (2025.01); *H10F 39/804* (2025.01); *H10F 39/809* (2025.01); *H10F 39/811* (2025.01)

(58) Field of Classification Search
CPC ... H01L 22/32; H01L 21/3205; H01L 21/768; H01L 22/00; H01L 23/522; H10F 39/026;
(Continued)

(56) References Cited

U.S. PATENT DOCUMENTS 11,699,653 B2 * 7/2023 Kazue ............... H01L 21/76898 257/432
2006/0171698 A1 8/2006 Ryu et al.
(Continued)

FOREIGN PATENT DOCUMENTS

JP 2006-216935 8/2006
JP 2008-140819 6/2008
(Continued)

OTHER PUBLICATIONS

International Search Report and Written Opinion prepared by the Japan Patent Office on Mar. 25, 2022, for International Application No. PCT/JP2022/000888, 2 pgs.

*Primary Examiner* — David Vu
(74) *Attorney, Agent, or Firm* — SHERIDAN ROSS P.C.

(57) ABSTRACT

Provided is a semiconductor device including a stack including a semiconductor substrate, an opening provided extending from a first surface of the stack and filled with an insulating material, a pad electrode provided at a bottom of the opening, a wiring layer provided in a planar region of the stack overlapping a planar region where the opening is provided in plan view from the first surface, the wiring layer being electrically being connected to the pad electrode, and a through electrode provided in a planar region different from the planar region where the opening is provided in the plan view and provided extending from a second surface of the stack opposite to the first surface.

20 Claims, 19 Drawing Sheets

(58) Field of Classification Search
CPC .... H10F 39/804; H10F 39/809; H10F 39/811; H10F 39/018; H10F 39/12; H10F 39/199; H10F 39/8053; H10F 39/8063; H04N 25/70
See application file for complete search history.

(56) References Cited

U.S. PATENT DOCUMENTS

| | | | | |
|---|---|---|---|---|
| 2008/0128848 | A1 | 6/2008 | Suzuki et al. | |
| 2010/0327383 | A1* | 12/2010 | Hayasaki | H01L 23/481<br>257/E31.127 |
| 2014/0110811 | A1 | 4/2014 | Tsukimura | |

FOREIGN PATENT DOCUMENTS

| | | |
|---|---|---|
| JP | 2009-158862 | 7/2009 |
| JP | 2014-086596 | 5/2014 |

* cited by examiner

SEMICONDUCTOR DEVICE

CROSS REFERENCE TO RELATED APPLICATIONS

This application is a national stage application under 35 U.S.C. 371 and claims the benefit of PCT Application No. PCT/JP2022/000888, having an international filing date of 13 Jan. 2022, which designated the United States, which PCT application claimed the benefit of Japanese Patent Application No. 2021-054562, filed 29 Mar. 2021, the entire disclosures of each of which are incorporated herein by reference.

TECHNICAL FIELD

The present disclosure relates to a semiconductor device.

BACKGROUND ART

In recent years, along with downsizing of electronic devices, downsizing of semiconductor devices mounted on the electronic devices has been required.

For example, there has been proposed a technique for mounting a semiconductor device on a wiring substrate in a more space-saving manner without using a bonding wire by bonding the semiconductor device to the wiring substrate by a flip chip method.

Furthermore, there has been proposed a technique for significantly reducing the size of a semiconductor device by three-dimensionally stacking a plurality of semiconductor substrates. In a semiconductor device having such a stack structure, electrical connection in the stacking direction is established by a through electrode penetrating a semiconductor substrate.

On the other hand, as described in the following Patent Document 1, for a semiconductor device, a probe test for determining the quality of the semiconductor device is performed before the semiconductor device is mounted on a wiring substrate. In the probe test, the quality of the semiconductor device is determined by bringing a probe into contact with a pad electrode of the semiconductor device to confirm the operation of the semiconductor device and the like.

CITATION LIST

Patent Document

Patent Document 1: Japanese Patent Application Laid-Open No. 2009-158862

SUMMARY OF THE INVENTION

Problems to be Solved by the Invention

In the probe test, the probe, however, is pressed against the pad electrode of the semiconductor device, so that stress is applied to the inside of the semiconductor device due to the pressing of the probe. This may develop a crack and the like in the internal structure of the semiconductor device due to the stress from the probe.

In particular, in a semiconductor device having a stack structure, a structure in the stacking direction is complicated, so that the stress from the probe has a significant impact on the internal structure. Therefore, for the semiconductor device having a stack structure, the probe test has a significant impact on reliability of the semiconductor device.

Therefore, the present disclosure proposes a novel and improved semiconductor device capable of further reducing the impact of the probe test.

Solutions to Problems

According to the present disclosure, provided is a semiconductor device including a stack including a semiconductor substrate, an opening provided extending from a first surface of the stack and filled with an insulating material, a pad electrode provided at a bottom of the opening, a wiring layer provided in a planar region of the stack overlapping a planar region where the opening is provided in plan view from the first surface, the wiring layer being electrically connected to the pad electrode, and a through electrode provided in a planar region different from the planar region where the opening is provided in the plan view and provided extending from a second surface of the stack opposite to the first surface.

According to the present disclosure, it is possible to arrange the opening through which the pad electrode is exposed and the through electrode so as to prevent stress applied to the stack by the probe pressed against the pad electrode at the time of the probe test during the manufacturing process from directly acting on the through electrode.

MODE FOR CARRYING OUT THE INVENTION

Figure 1:
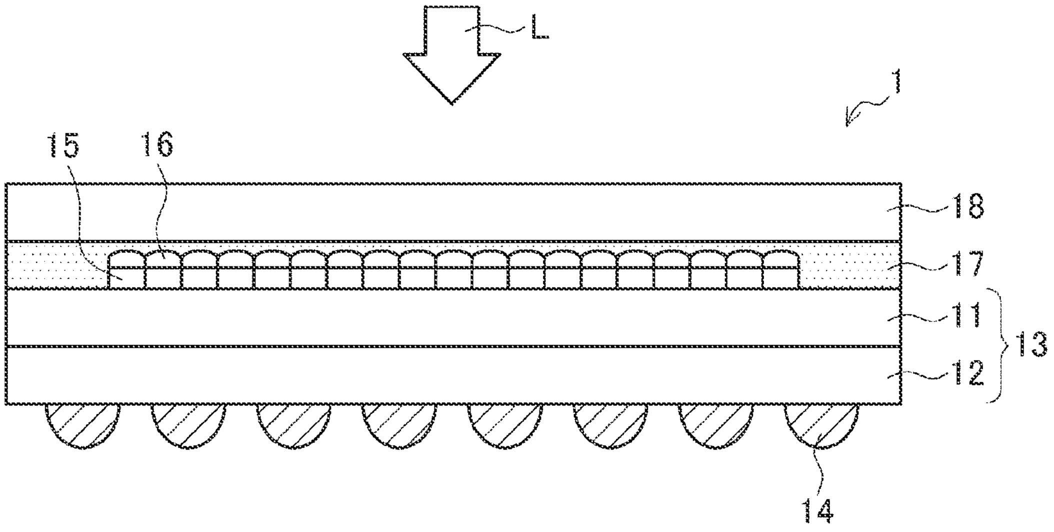
FIG. 1 is a longitudinal cross-sectional view schematically depicting an imaging device according to an embodiment of the present disclosure.

Hereinafter, preferred embodiments of the present disclosure will be described in detail with reference to the accompanying drawings. Note that, in the present specification and drawings, components having substantially the same functional configuration are denoted by the same reference numerals to avoid the description from being redundant.

Note that the description will be given in the following order.

1. Imaging device
   - 1.1. Overall Configuration
   - 1.2. Detailed Configuration
2. Modification Example
3. Derived Example
4. Electronic Device
5. Application Example

1. Imaging Device (1.1. Overall Configuration)

First, an overall configuration of an imaging device according to one embodiment of the present disclosure will be described with reference to FIGS. 1 to 4. The imaging device according to the present embodiment to be described below is a specific example of a semiconductor device in the present disclosure.

FIG. 1 is a longitudinal cross-sectional view schematically depicting the imaging device according to the present embodiment. As depicted in FIG. 1, the imaging device 1 according to the present embodiment is a semiconductor package in which a stack 13 having a first substrate 11 and a second substrate 12 stacked together is packaged. The imaging device 1 can convert light incident from a direction indicated by an arrow L in the drawing into an electrical signal and output the electrical signal.

Provided on a lower surface of the second substrate 12 is a plurality of back electrodes 14 serving as electrical connection points with an external substrate (not illustrated) (that is, a substrate on which the imaging device 1 is mounted). Each back electrode 14 may be, for example, a solder ball containing tin (Sn), silver (Ag), copper (Cu), or the like.

Provided on an upper surface of the first substrate 11 are a red (R), green (G), or blue (B) color filter 15 and an on-chip lens 16. Further provided on the upper surface of the first substrate 11 is a transparent substrate 18 such as a glass substrate that protects the on-chip lens 16. Moreover, a space between the upper surface of the first substrate 11 and the transparent substrate 18 is filled with a glass sealing resin 17.

Such a structure in which no gap (also referred to as cavity) is provided around the color filter 15 and the on-chip lens 16 is also referred to as a cavity-less structure. The imaging device 1 according to the present embodiment may be provided with a cavity-less structure as depicted in FIG. 1, or may be provided with a cavity structure in which a gap is provided around the color filter 15 and the on-chip lens 16.

Figure 2:
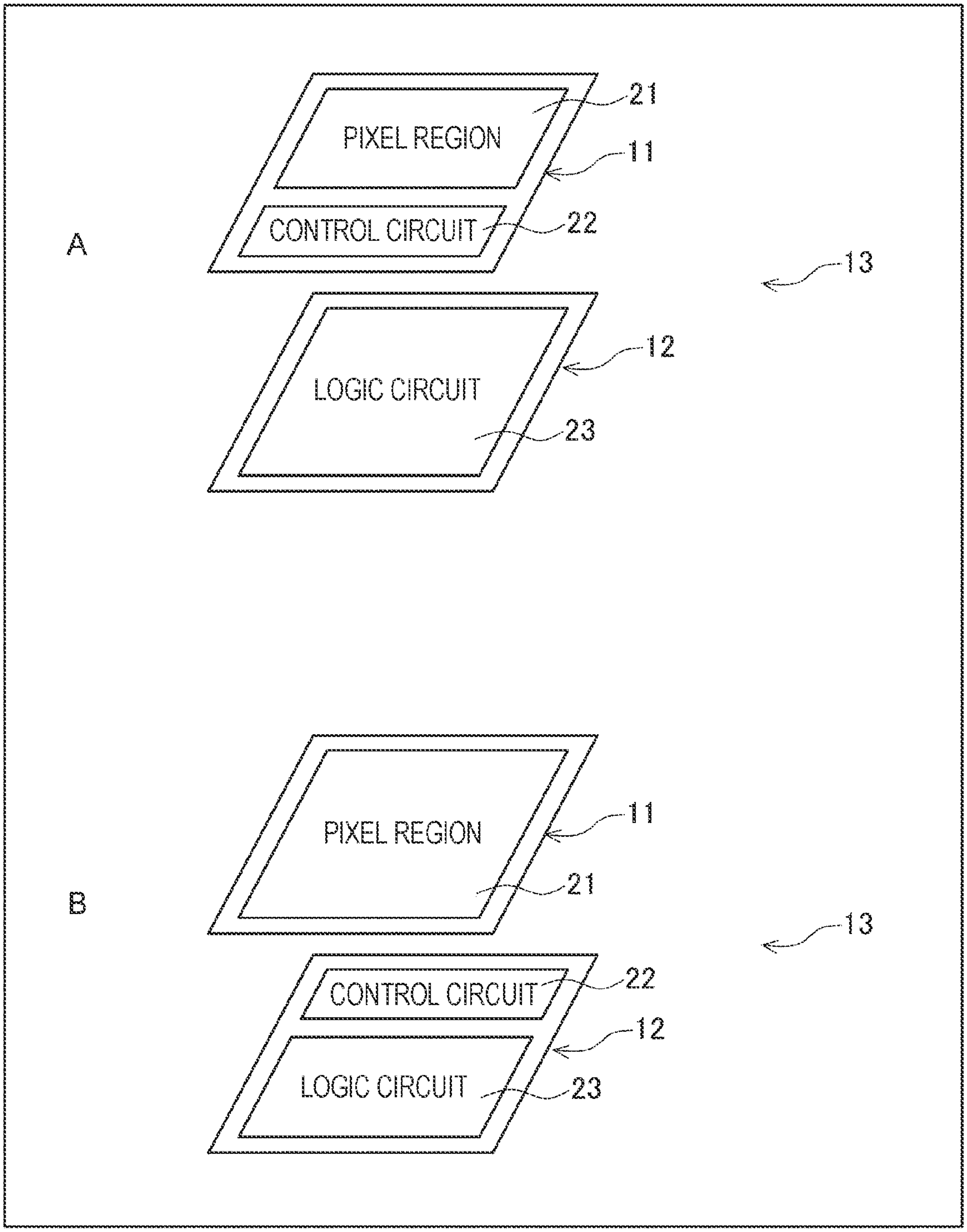
FIG. 2 is a schematic diagram depicting a layout of a pixel region and various circuits on a first substrate and a second substrate.

FIG. 2 is a schematic diagram depicting a layout of a pixel region and various circuits on the first substrate 11 and the second substrate 12.

As depicted in A of FIG. 2, the first substrate 11 may be provided with a pixel region 21 where pixels that perform photoelectric conversion are two-dimensionally arranged, and a control circuit 22 that controls each pixel. The second substrate 12 may be provided with a logic circuit 23 including a signal processing circuit that processes a pixel signal output from each pixel and the like.

Alternatively, as depicted in B of FIG. 2, the first substrate 11 may be provided with only the pixel region 21. The second substrate 12 may be provided with the control circuit 22 and the logic circuit 23.

That is, the logic circuit 23, or the logic circuit 23 and the control circuit 22 may be provided in the second substrate 12 different from the first substrate 11 in which the pixel region 21 is provided. The imaging device 1 is configured as the stack 13 having the first substrate 11 and the second substrate 12 stacked together as depicted in FIG. 2, so that it is possible to reduce the size as compared with a case where the pixel region 21, the control circuit 22, and the logic circuit 23 are two-dimensionally arranged in one substrate.

Figure 3:
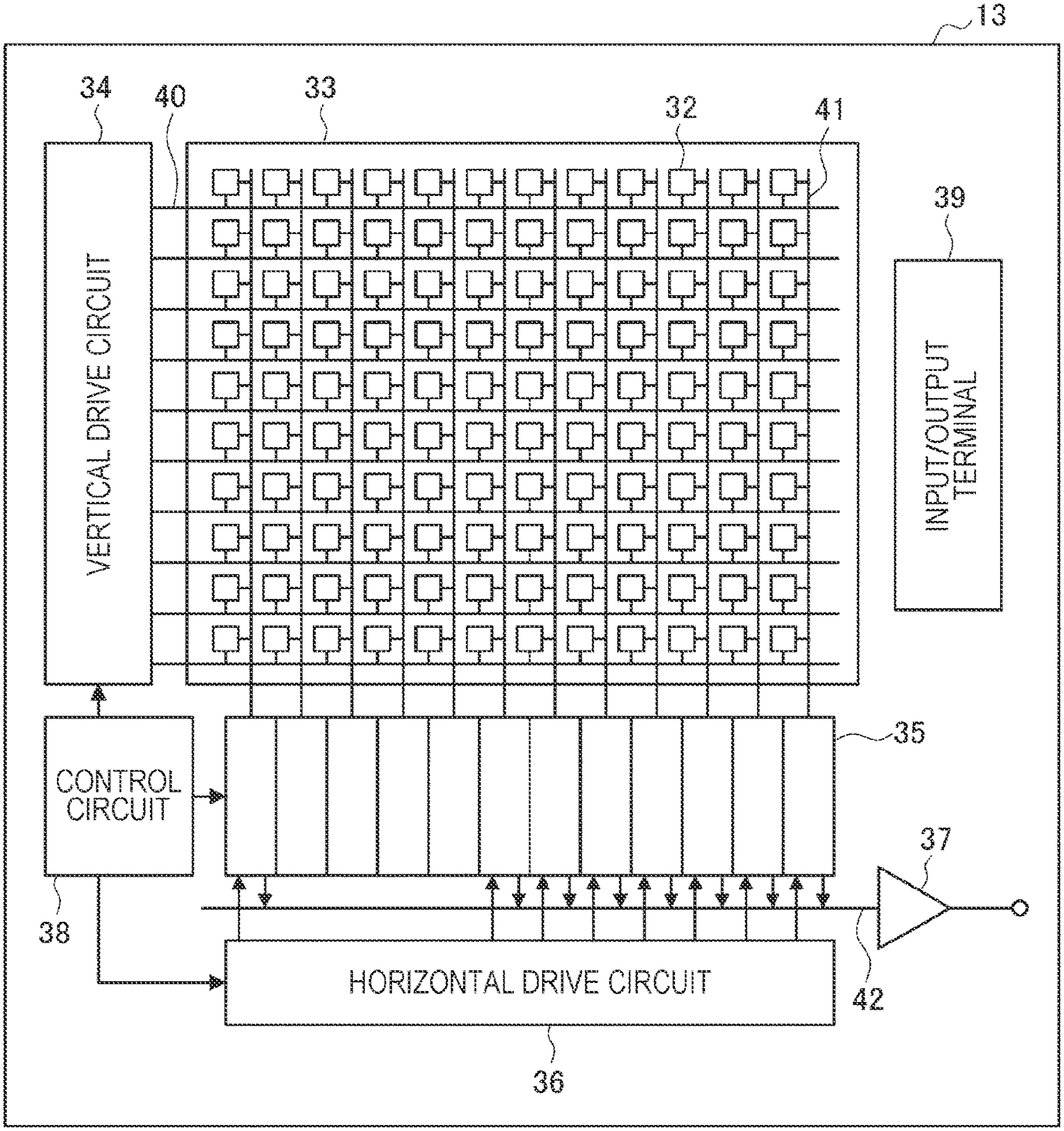
FIG. 3 is a schematic diagram depicting a circuit configuration example in a stack.

FIG. 3 is a schematic diagram depicting a circuit configuration example in the stack 13. As depicted in FIG. 3, the stack 13 includes a pixel array unit 33, a vertical drive circuit 34, a column signal processing circuit 35, a horizontal drive circuit 36, an output circuit 37, a control circuit 38, and an input/output terminal 39.

The pixel array unit 33 is a region where a plurality of pixels 32 is arranged in a two-dimensional array. Each of the plurality of pixels 32 includes a photoelectric conversion element such as a photodiode and a plurality of pixel transistors. A circuit configuration of the photoelectric conversion element and the plurality of pixel transistors in each of the pixels 32 will be described later with reference to FIG. 4.

This control circuit 38 receives an input clock and data indicating an operation mode and the like, and outputs data such as internal information of the stack 13. More specifically, the control circuit 38 generates, on the basis of a vertical synchronization signal, a horizontal synchronization signal, and a master clock, a clock signal and a control signal in accordance with which the vertical drive circuit 34, the column signal processing circuit 35, the horizontal drive circuit 36, and the like operate. Moreover, the control circuit 38 outputs the clock signal and the control signal thus generated to the vertical drive circuit 34, the column signal processing circuit 35, the horizontal drive circuit 36, and the like.

The vertical drive circuit 34 includes, for example, a shift register. The vertical drive circuit 34 selects a predetermined pixel drive line 40 and supplies a pulse for driving the pixel 32 to the selected pixel drive line 40. With this configuration, the vertical drive circuit 34 can drive the pixels 32 row by row. For example, the vertical drive circuit 34 sequentially selects and scans each of the pixels 32 of the pixel array unit 33 in a vertical direction row by row. With this configuration, the vertical drive circuit 34 can supply the pixel signal generated in each of the pixels 32 to the column signal processing circuit 35 via a vertical signal line 41.

The column signal processing circuit 35 is arranged for each column of the pixels 32. The column signal processing circuit 35 performs signal processing such as noise removal on the pixel signals output from the pixels 32 of one row for each column of the pixels 32. For example, the column signal processing circuit 35 may perform signal processing such as correlated double sampling (CDS) for removing a pixel-specific pattern fixed noise and analog to digital (AD) conversion.

The horizontal drive circuit 36 includes, for example, a shift register. The horizontal drive circuit 36 selects each of the column signal processing circuits 35 in turn by sequentially outputting a horizontal scanning pulse. With this configuration, the horizontal drive circuit 36 can output the pixel signal from each column signal processing circuit 35 to a horizontal signal line 42.

The output circuit 37 performs signal processing on the pixel signals sequentially supplied from each of the column signal processing circuits 35 via the horizontal signal line 42, and outputs the pixel signals subjected to the signal processing to the outside. The output circuit 37 may perform only buffering, or may perform black level adjustment, column variation correction, various digital signal processing, or the like, for example.

The input/output terminal 39 inputs and outputs signals to and from the outside. For example, the input/output terminal 39 may receive data indicating the operation mode or the like from the outside, or may output information such as the operation mode of the imaging device 1 to the outside.

The imaging device 1 including the stack 13 having the above-described configuration is a so-called column AD type CMOS image sensor in which the column signal processing circuit 35 that performs CDS processing and AD conversion processing is arranged for each column of the pixels 32.

Figure 4:
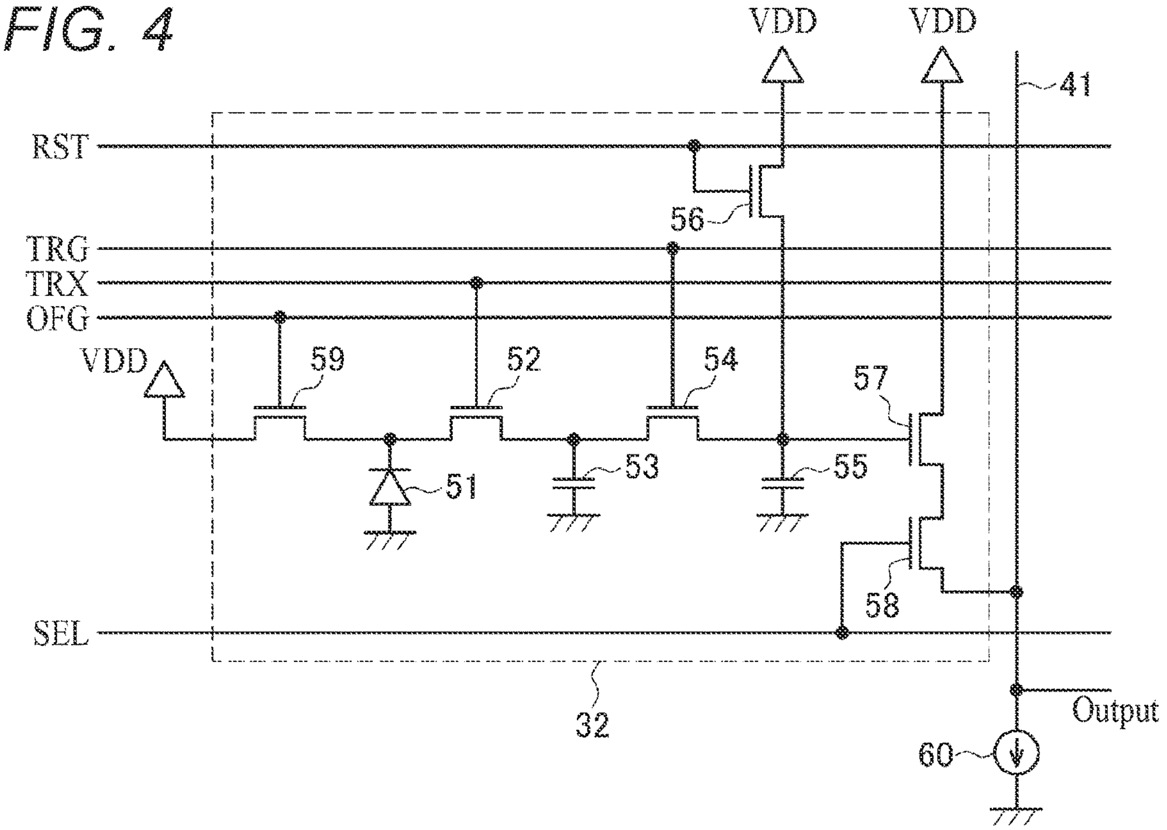
FIG. 4 is a circuit diagram depicting an equivalent circuit of each pixel.

FIG. 4 is a circuit diagram depicting an equivalent circuit of each pixel 32. With the pixel 32 having the following equivalent circuit, it is possible for the imaging device 1 to enable an electronic global shutter function.

As depicted in FIG. 4, the pixel 32 includes a photoelectric conversion element 51, a first transfer transistor 52, a memory section (MEM) 53, a second transfer transistor 54, a floating diffusion (FD) region 55, a reset transistor 56, an amplification transistor 57, a selection transistor 58, and a discharge transistor 59.

The photoelectric conversion element 51 is a photodiode that generates and accumulates charges corresponding to the received light amount. The photoelectric conversion element 51 has an anode terminal grounded and has a cathode terminal connected to the memory section 53 via the first transfer transistor 52. Furthermore, the cathode terminal of the photoelectric conversion element 51 is also connected to the discharge transistor 59 provided for discharging unnecessary charges.

The first transfer transistor 52 is controlled into an ON state by a transfer signal TRX to read the charges generated by the photoelectric conversion element 51 and transfer the charges to the memory section 53.

The memory section 53 is a charge holding section that temporarily holds charges until the charges are transferred to the FD region 55.

The second transfer transistor 54 is controlled into the ON state by a transfer signal TRG to read the charges held in the memory section 53 and transfer the charges to the FD region 55.

The FD region 55 is a charge holding section that holds the charges read from the memory section 53 so as to allow the charges to be read as a pixel signal.

The reset transistor 56 is controlled into the ON state by a reset signal RST to discharge the charges accumulated in the FD region 55 to a constant voltage source VDD. With this configuration, the reset transistor 56 can reset a potential of the FD region 55 to a potential before the charges are accumulated.

The amplification transistor 57 outputs a pixel signal corresponding to the potential of the FD region 55. Specifically, the amplification transistor 57 constitutes a source follower circuit along with a load MOS 60 as a constant current source to output a pixel signal at a level corresponding to the amount of charges accumulated in the FD region 55. The load MOS 60 is, for example, a MOS transistor, and is provided inside the column signal processing circuit 35. With this configuration, the amplification transistor 57 can output the pixel signal to the column signal processing circuit 35 via the selection transistor 58.

The selection transistor 58 is controlled into the ON state when the pixel 32 is selected by a selection signal SEL to output the pixel signal of the pixel 32 to the column signal processing circuit 35 via the vertical signal line 41.

The discharge transistor 59 is controlled into the ON state by a discharge signal OFG to discharge unnecessary charges accumulated in the photoelectric conversion element 51 to the constant voltage source VDD.

Note that the transfer signal TRX, the transfer signal TRG, the reset signal RST, the discharge signal OFG, and the selection signal SEL are supplied from the vertical drive circuit 34 via the pixel drive line 40.

Next, the operation of the pixel 32 having the equivalent circuit depicted in FIG. 4 will be described.

First, before the start of exposure, a High-level discharge signal OFG is supplied to the discharge transistor 59 to control the discharge transistor 59 into the ON state. Accordingly, the charges accumulated in the photoelectric conversion element 51 are discharged to the constant voltage source VDD, thereby reset the photoelectric conversion elements 51 of all the pixels 32.

Next, after the photoelectric conversion element 51 is reset, the discharge transistor 59 is controlled into an OFF state by a Low-level discharge signal OFG. Thereafter, exposure starts in all the pixels 32 of the pixel array unit 33.

After a predetermined exposure time has elapsed, in all the pixels 32 of the pixel array unit 33, the first transfer transistor 52 is controlled into the ON state by the transfer signal TRX to transfer the charges accumulated in the photoelectric conversion element 51 to the memory section 53.

After the first transfer transistor 52 is controlled into the OFF state, the charges held in the memory section 53 of each pixel 32 are sequentially read to the column signal processing circuit 35 row by row.

Specifically, the second transfer transistor 54 of the pixel 32 of the read row is controlled into the ON state by the transfer signal TRG to transfer the charges held in the memory section 53 of the pixel 32 of the read row to the FD region 55. Thereafter, when the selection transistor 58 is controlled into the ON state by the selection signal SEL, a pixel signal at a level corresponding to the amount of charges accumulated in the FD region 55 is output from the amplification transistor 57 to the column signal processing circuit 35 via the selection transistor 58.

With the above-described operation, the imaging device 1 can make the exposure times of all the pixels 32 of the pixel array unit 33 identical to each other and sequentially read, from the memory section 53, the charges temporarily held in the memory section 53 row by row after the end of exposure. With this configuration, the imaging device 1 can operate (capture an image) by a global shutter method.

Note that the circuit configuration of the pixel 32 is not limited to the circuit configuration depicted in FIG. 4. For example, the pixel 32 may have a circuit configuration that includes no memory section 53 and is adapted to operation by a so-called rolling shutter method.

Furthermore, the pixel 32 may be provided as a sharing pixel by which some pixel transistors are shared by a plurality of the pixels 32. For example, the pixel 32 may be provided as a sharing pixel by which each pixel 32 includes the first transfer transistor 52, the memory section 53, and the second transfer transistor 54, and the FD region 55, the reset transistor 56, the amplification transistor 57, and the selection transistor 58 are shared by the plurality of pixels 32 (for example, four pixels 32 or the like).

(1.2. Detailed Configuration)

Figure 5:
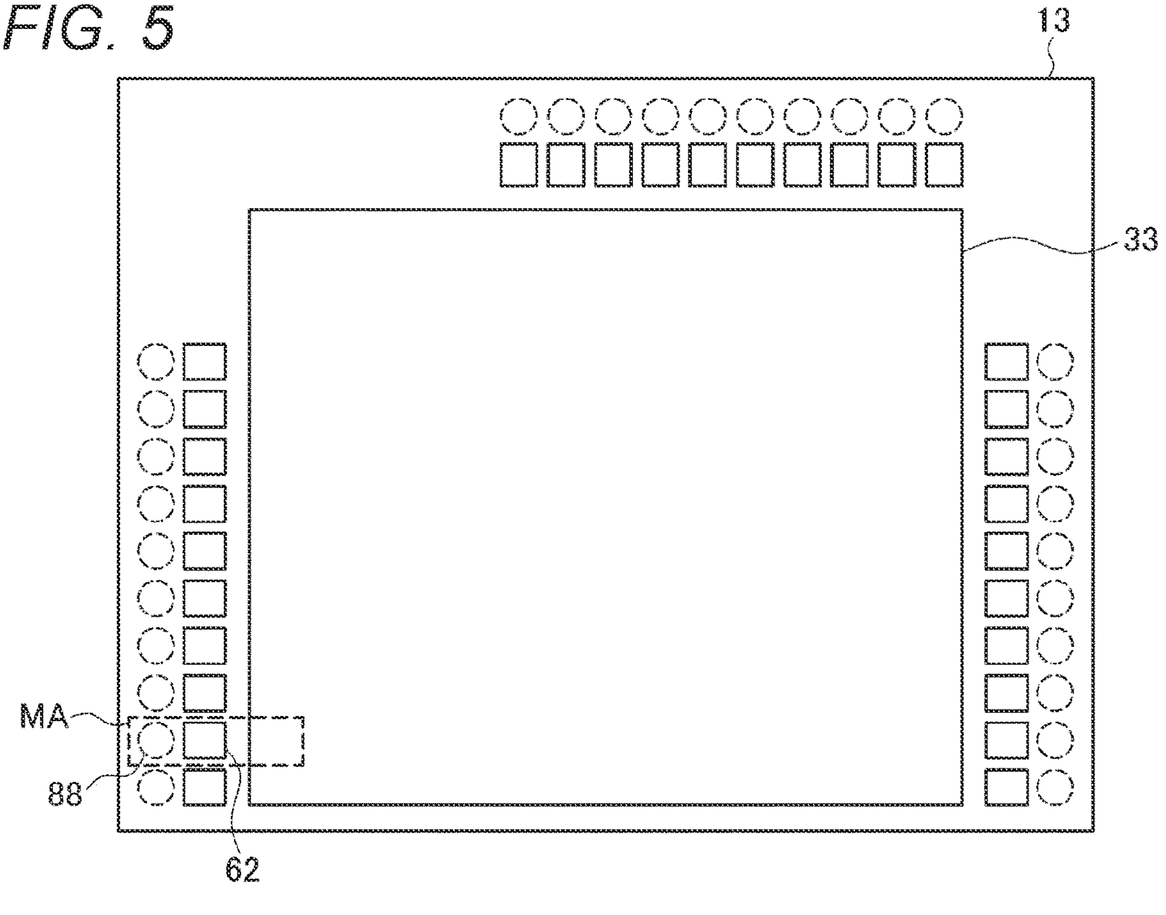
FIG. 5 is a plan view depicting an example of a planar configuration of the stack.

Next, a detailed configuration of the imaging device 1 according to the present embodiment will be described with reference to FIGS. 5 to 7. FIG. 5 is a plan view depicting an example of a planar configuration of the stack 13.

As depicted in FIG. 5, a plurality of pairs of through electrodes 85 and pad electrodes 62 is provided in the stack 13 of the imaging device 1 according to the present embodiment.

The through electrode 85 is provided on a back surface side of the stack 13 in order to take out the pixel signal and the like. In the imaging device 1, the pixel signal is output to the outside from the back electrode 14 provided on the back surface of the stack 13. Therefore, providing the through electrode 85 allows the imaging device 1 to take out the pixel signal subjected to signal processing in various circuits inside the stack 13 to the back surface side of the stack 13 and output the pixel signal from the back electrode 14 to the outside.

The pad electrode 62 is provided for a probe test to be conducted for determining whether or not various circuits provided in the stack 13 operate correctly (that is, whether or not the stack 13 is a non-defective product) during a manufacturing process of the imaging device 1. The probe test is a test for examining whether or not various circuits provided in the stack 13 operate correctly and the like by pressing a needle-shaped probe against the pad electrode 62 exposed on the surface of the stack 13 to confirm the operation. Providing the pad electrode 62 allows the imaging device 1 to determine whether or not the stack 13 is defective in the middle of the manufacturing process, so that a loss at the time of manufacturing can be reduced. Note that, in order to prevent a malfunction, the occurrence of noise, or the like in the manufactured imaging device 1, the pad electrode 62 is buried so as not to be exposed on the surface of the stack 13 after the probe test.

In the imaging device 1 according to the present embodiment, the through electrode 85 and the pad electrode 62 are provided in an outer peripheral region of the pixel array unit 33. For example, the through electrode 85 may be provided adjacent to a side of the pad electrode 62 remote from the pixel array unit 33 (that is, a region outside the pixel array unit 33). Furthermore, the through electrode 85 is provided in a planar region different from a planar region of the pad electrode 62 in plan view with which the probe used for the probe test can be brought into contact. With this configuration, the imaging device 1 can reduce the impact of stress caused by the pressing of the probe at the time of the probe test.

Next, with reference to FIG. 6, a detailed configuration of the imaging device 1 will be described in more detail focusing on the configurations of the through electrode 85 and the pad electrode 62. FIG. 6 is an enlarged longitudinal cross-sectional view depicting a region of interest MA in FIG. 5. The region of interest MA is, for example, a region including the through electrode 85, the pad electrode 62, and a part of the pixel array unit 33.

Figure 6:
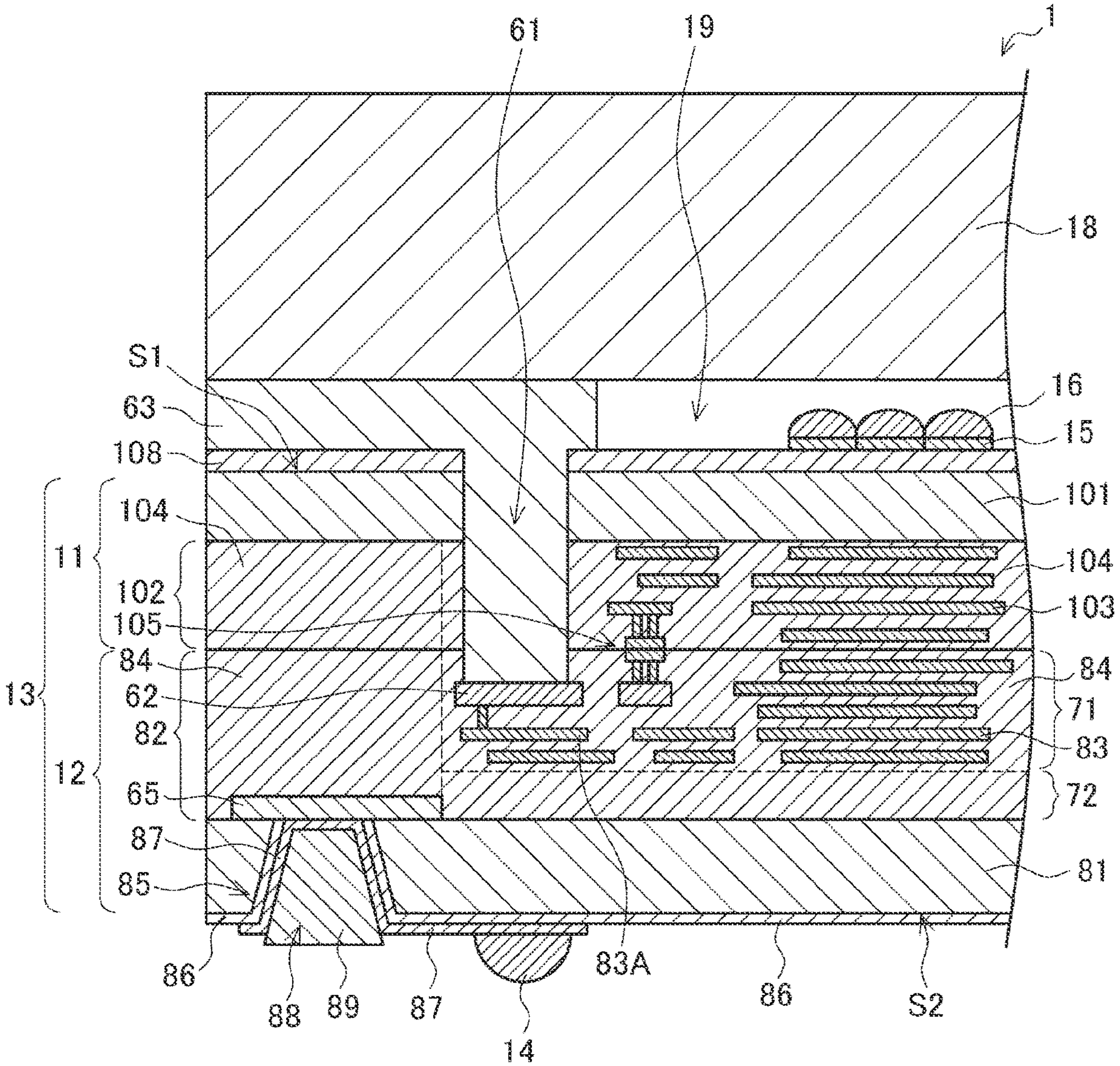
FIG. 6 is an enlarged longitudinal cross-sectional view depicting a region of interest in FIG. 5.

As depicted in FIG. 6, the imaging device 1 includes the stack 13 having the first substrate 11 and the second substrate 12 stacked together.

The first substrate 11 includes a first semiconductor substrate 101 including silicon (Si) or the like, and a first multilayer wiring layer 102 stacked on a side (lower side as viewed from the front of FIG. 6) of the first semiconductor substrate 101 adjacent to the second substrate 12. In the first multilayer wiring layer 102, a pixel circuit of the pixel region 21 depicted in FIG. 2 and the like are provided.

The first multilayer wiring layer 102 includes a plurality of wiring layers 103 including a conductive material and an interlayer insulating film 104 including an insulating material and provided between the wiring layers 103. The wiring layer 103 may include a conductive material such as copper (Cu), aluminum (Al), or tungsten (W). For example, the interlayer insulating film 104 may include an insulating material such as silicon oxide ($SiO_2$), silicon nitride (SiN), or silicon oxynitride (SiON). In the plurality of wiring layers 103 and the interlayer insulating film 104, all the layers may include the same material, or two or more materials may be selectively used for each layer.

In the first semiconductor substrate 101, the photoelectric conversion element 51 (not illustrated) such as a photodiode is provided for each pixel 32. Furthermore, the first semiconductor substrate 101 and the first multilayer wiring layer 102 are provided with the first transfer transistor 52, the second transfer transistor 54, the memory section (MEM) 53, and the like that are used to transfer the charges obtained as a result of photoelectric conversion by the photoelectric conversion element 51.

The second substrate 12 includes a second semiconductor substrate 81 including silicon (Si) or the like, and a second multilayer wiring layer 82 stacked on a side (upper side as viewed from the front of FIG. 6) of the second semiconductor substrate 81 adjacent to the first substrate 11. The second multilayer wiring layer 82 is provided with the control circuit 22, the logic circuit 23, and the like depicted in FIG. 2.

The second multilayer wiring layer 82 includes a plurality of wiring layers 83 including a conductive material and an interlayer insulating film 84 including an insulating material and provided between the wiring layers 83. The wiring layer 83 may include a conductive material such as copper (Cu), aluminum (Al), or tungsten (W). For example, the interlayer insulating film 84 may include an insulating material such as silicon oxide ($SiO_2$), silicon nitride (SiN), or silicon oxynitride (SiON). In the plurality of wiring layers 83 and the interlayer insulating film 84, all the layers may include the same material, or two or more materials may be selectively used for each layer.

In the example depicted in FIG. 6, the first multilayer wiring layer 102 of the first substrate 11 includes four wiring layers 103, and the second multilayer wiring layer 82 of the second substrate 12 includes five wiring layers 83. The number of wiring layers 103 and the number of wiring layers 83, however, are not limited to the above-described numbers of layers, and may be any number of layers. Furthermore, dummy wiring may be provided in a region of the first multilayer wiring layer 102 where no wiring layer 103 is provided and a region of the second multilayer wiring layer 82 where no wiring layer 83 is provided.

The first substrate 11 and the second substrate 12 are stacked with the first multilayer wiring layer 102 and the second multilayer wiring layer 82 facing each other. Furthermore, an electrode bonding structure 105 is provided at an interface between the first multilayer wiring layer 102 and the second multilayer wiring layer 82. The electrode bonding structure 105 is formed when a metal electrode exposed on a surface of the first multilayer wiring layer 102 facing the second substrate 12 and a metal electrode exposed on a surface of the second multilayer wiring layer 82 facing the first substrate 11 are bonded together by heat treatment. The electrode bonding structure 105 can efficiently connect the wiring layer 103 included in the first multilayer wiring layer 102 and the wiring layer 83 included in the second multilayer wiring layer 82 at a shorter distance.

Here, the first semiconductor substrate 101 in the outer peripheral region of the pixel array unit 33 has an opening 61 provided through a first surface S1 of the first semiconductor substrate 101 remote from the second substrate 12. The opening 61 is filled with a buried layer 63, and the pad electrode 62 is provided at a bottom of the opening 61.

For example, the opening 61 is provided penetrating a planarization film 108, the first semiconductor substrate 101, and the first multilayer wiring layer 102 from the first surface S1 of the first semiconductor substrate 101 to the second multilayer wiring layer 82 to expose, at its bottom, the pad electrode 62 provided in the second multilayer wiring layer 82 of the second substrate 12. As will be described later, the opening 61 is provided in a planar region different from the planar region where the through electrode 85 is provided in plan view from the first surface S1 of the first semiconductor substrate 101.

The pad electrode 62 includes a conductive material such as copper (Cu) or aluminum (Al) and is provided at the bottom of the opening 61. For example, the pad electrode 62 may be provided inside the second multilayer wiring layer 82 of the second substrate 12.

The opening 61 is provided for the probe test to be conducted during the manufacturing process of the imaging device 1. The probe test on the imaging device 1 will be described with reference to FIG. 7. FIG. 7 is a longitudinal cross-sectional view depicting a state of the cross-sectional structure depicted in FIG. 6 when the probe test is conducted.

Figure 7:
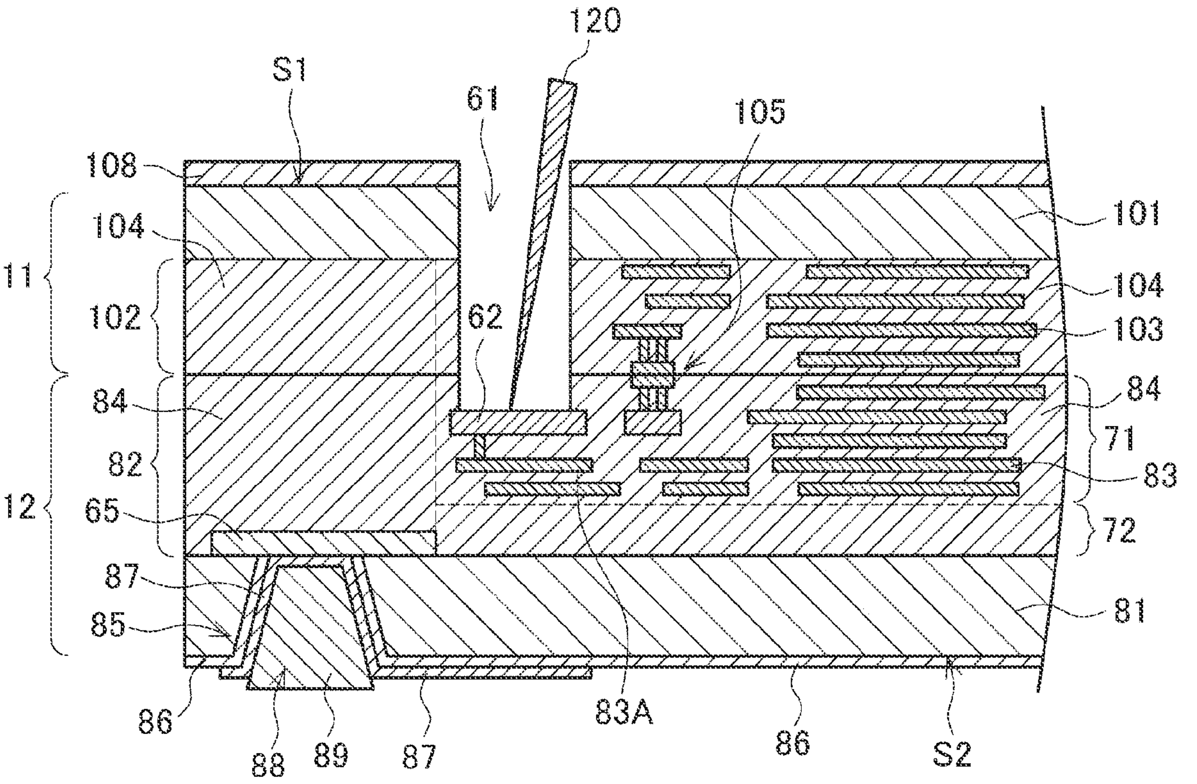
FIG. 7 is a longitudinal cross-sectional view depicting a state of the cross-sectional structure depicted in FIG. 6 when a probe test is conducted.

As depicted in FIG. 7, for example, at the time of the probe test, the opening 61 exposes the pad electrode 62 provided in the second multilayer wiring layer 82 of the second substrate 12. This configuration allows the probe 120 to come into contact with the pad electrode 62 through the opening 61 and apply a voltage or the like to the pad electrode 62, so that it is possible to confirm the operation of various circuits provided in the first substrate 11 and the second substrate 12. Note that the needle-shaped probe 120 is pressed against the pad electrode 62 during the probe test, so that an indentation is formed on the pad electrode 62 by the probe.

After the probe test, the opening 61 is filled with the buried layer 63 to prevent a malfunction or the occurrence of noise. The buried layer 63 may include an insulating inorganic material such as silicon oxide ($SiO_2$), silicon nitride (SiN), or silicon oxynitride (SiON), or may include an insulating organic material such as siloxane.

The buried layer 63 may be provided extending over the first surface S1 of the first semiconductor substrate 101 remote from the second substrate 12. The buried layer 63 is provided extending over the first surface S1 of the outer peripheral region of the pixel array unit 33, so that a gap 19 (that is, cavity) enclosing the color filter 15 and the on-chip lens 16 can be formed between the first substrate 11 and the transparent substrate 18.

Specifically, the color filter 15 and the on-chip lens 16 are provided over the first surface S1 with the planarization film 108 including an insulating material interposed between the first surface S1, and the color filter 15 and the on-chip lens 16. Moreover, the transparent substrate 18 such as a glass substrate is provided over the first surface S1 of the first semiconductor substrate 101 with the buried layer 63 interposed between the first surface S1 and the transparent substrate 18. Since the buried layer 63 is provided in the outer peripheral region of the pixel array unit 33, the gap 19 (that is, cavity) can be formed between the first semiconductor substrate 101 and the transparent substrate 18 in the pixel array unit 33. That is, the imaging device 1 depicted in FIG. 6 has a cavity structure in which the gap 19 is provided around the color filter 15 and the on-chip lens 16.

Figure 8:
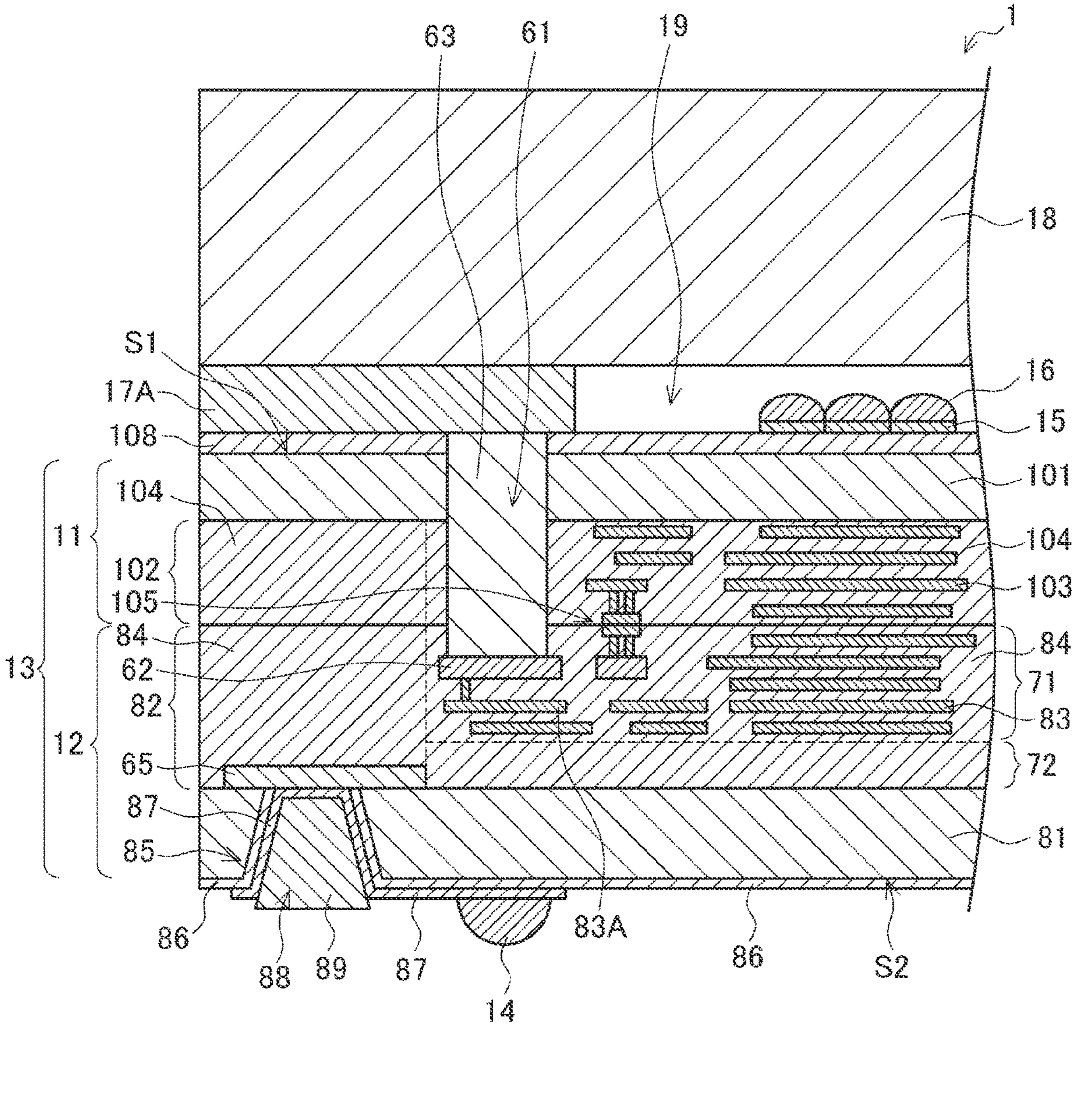
FIG. 8 is a longitudinal cross-sectional view depicting another example of the cross-sectional structure depicted in FIG. 6.

Note that, as depicted in FIG. 8, the buried layer 63 may be provided only inside the opening 61. FIG. 8 is a longitudinal cross-sectional view depicting another example of the cross-sectional structure depicted in FIG. 6. In the cross-sectional structure depicted in FIG. 8, the buried layer 63 is provided inside the opening 61. On the first surface S1 of the first semiconductor substrate 101 including the buried layer 63 and the planarization film 108, a sealing resin 17A is provided in the outer peripheral region of the pixel array unit 33. The transparent substrate 18 is provided over the first surface S1 of the first semiconductor substrate 101 with the sealing resin 17A interposed between the transparent substrate 18 and the first surface S1, so that the gap 19 enclosing the color filter 15 and the on-chip lens 16 can be formed between the first substrate 11 and the transparent substrate 18. In such a case, the buried layer 63 may include a light-shielding resin such as a black resin. Furthermore, the sealing resin 17A may include a transparent inorganic material such as silicon oxide ($SiO_2$), silicon nitride (SiN), or silicon oxynitride (SiON), or may include a transparent organic material such as siloxane.

Furthermore, a wiring layer 83A electrically connected to the pad electrode 62 is provided in a planar region overlapping the planar region where the opening 61 is provided in plan view from the first surface S1. Specifically, the wiring layer 83A electrically connected to the pad electrode 62 is provided adjacent to a side of the opening 61 in the second substrate 12 (lower side as viewed from the front of FIG. 6). With this configuration, the imaging device 1 can improve the volume utilization efficiency in the stack 13 by further providing the wiring layer 83A in the planar region overlapping the planar region where the opening 61 used for the probe test is provided. It is therefore possible to further reduce the size of the imaging device 1.

Moreover, a protection element (not illustrated) electrically connected to the pad electrode 62 may be provided in the planar region overlapping the planar region where the opening 61 is provided in plan view from the first surface S1. Specifically, the second multilayer wiring layer 82 may include a wiring-use region 71 where the wiring layer 83A electrically connected to the pad electrode 62 is provided, and a protection element region 72 where the protection element electrically connected to the pad electrode 62 is provided.

The wiring-use region 71 is a region including the plurality of wiring layers 83A and the interlayer insulating film 84 provided between the wiring layers 83A, and is provided as a region of the second multilayer wiring layer 82 adjacent to the first multilayer wiring layer 102. The protection element region 72 is a region where the protection element such as a diode is provided, and is provided as a region of the second multilayer wiring layer 82 adjacent to the second semiconductor substrate 81. The protection element is electrically connected to the pad electrode 62 via the wiring layer 83A, so that various circuits provided inside the stack 13 can be protected from a surge (electro-static discharge: ESD) that is possibly input from the pad electrode 62.

On the other hand, the through electrode 85 is provided through a second surface S2, remote from the first substrate 11, of the second semiconductor substrate 81 in the outer peripheral region of the pixel array unit 33.

The through electrode 85 includes, for example, a redistribution layer 87 and a filling layer 89 buried in an inner wall of a through hole 88 penetrating the second semiconductor substrate 81 with an insulating layer 86 interposed between the inner wall, and the redistribution layer 87 and the filling layer 89. The through electrode 85 is electrically connected to a wiring layer 65 provided in the second multilayer wiring layer 82, so that the pixel signal subjected to signal processing in various circuits inside the imaging device 1 can be taken out to the second surface S2 of the second semiconductor substrate 81.

Specifically, the through hole 88 is provided penetrating the second semiconductor substrate 81 from the second surface S2 to expose the wiring layer 65 at its bottom. The insulating layer 86 includes silicon oxide ($SiO_2$), silicon nitride (SiN), silicon oxynitride (SiON), or the like, and is uniformly provided on a side surface of the through hole 88 and the second surface S2 of the second semiconductor substrate 81. The redistribution layer 87 includes titanium (Ti), copper (Cu), nickel (Ni), gold (Au), and the like sequentially stacked together, and is provided on the wiring layer 65 and the insulating layer 86 along the shape of the through hole 88. The redistribution layer 87 extends from the through electrode 85 to above the insulating layer 86 on the second surface S2 of the second semiconductor substrate 81, and is connected to the back electrode 14 on the second surface S2. The filling layer 89 includes a solder resist or a solder mask primarily containing an epoxy resin, a novolac resin, an acrylic resin, or the like, and is provided to fill the through hole 88.

The through electrode 85 is provided in the planar region different from the planar region where the opening 61 is provided in plan view from the first surface S1 of the first semiconductor substrate 101. This configuration makes it possible to prevent stress from the probe 120 from being directly applied to the through electrode 85 when the probe 120 is pressed against the pad electrode 62 via the opening 61. Therefore, the through electrode 85 can prevent a crack and the like from developing in the filling layer 89 or the like due to the stress from the probe 120.

Since the through hole 88 is provided penetrating the second semiconductor substrate 81, a configuration near the through hole 88 is weak against stress in a direction orthogonal to an in-plane direction of the second semiconductor substrate 81. That is, the through electrode 85 is weak against stress in the stacking direction of the stack 13 such as stress applied at the time of the probe test. Therefore, the imaging device 1 according to the present embodiment can efficiently prevent a crack from developing in the through electrode 85 due to stress at the time of the probe test by providing the through electrode 85 in the planar region different from the planar region where the opening 61 exposes the pad electrode 62.

With the above-described configuration, in the imaging device 1 according to the present embodiment, the wiring layer 103 of the first substrate 11 and the wiring layer 83 of the second substrate 12 are electrically connected by the electrode bonding structure 105 provided at the interface between the first multilayer wiring layer 102 and the second multilayer wiring layer 82. Furthermore, in the imaging device 1, the wiring layer 83 of the second substrate 12 and the back electrode 14 provided on the second surface S2 are electrically connected by the through electrode 85. With this configuration, it is possible to further reduce the planar area, so that the imaging device 1 can constitute a further downsized semiconductor package.

Furthermore, in the imaging device 1 according to the present embodiment, the opening 61 that exposes the pad electrode 62 at the time of the probe test during the manufacturing process and the through electrode 85 are provided in different planar regions in plan view from the first surface S1 of the first semiconductor substrate 101. With this configuration, the imaging device 1 can further reduce the impact, on the stack 13, of the stress applied from the probe 120 to the stack 13 at the time of the probe test.

2. Modification Example

Next, imaging devices 1A to 1C according to first to third modification examples will be described with reference to FIGS. 9A to 13.

First Modification Example

Figure 9A:
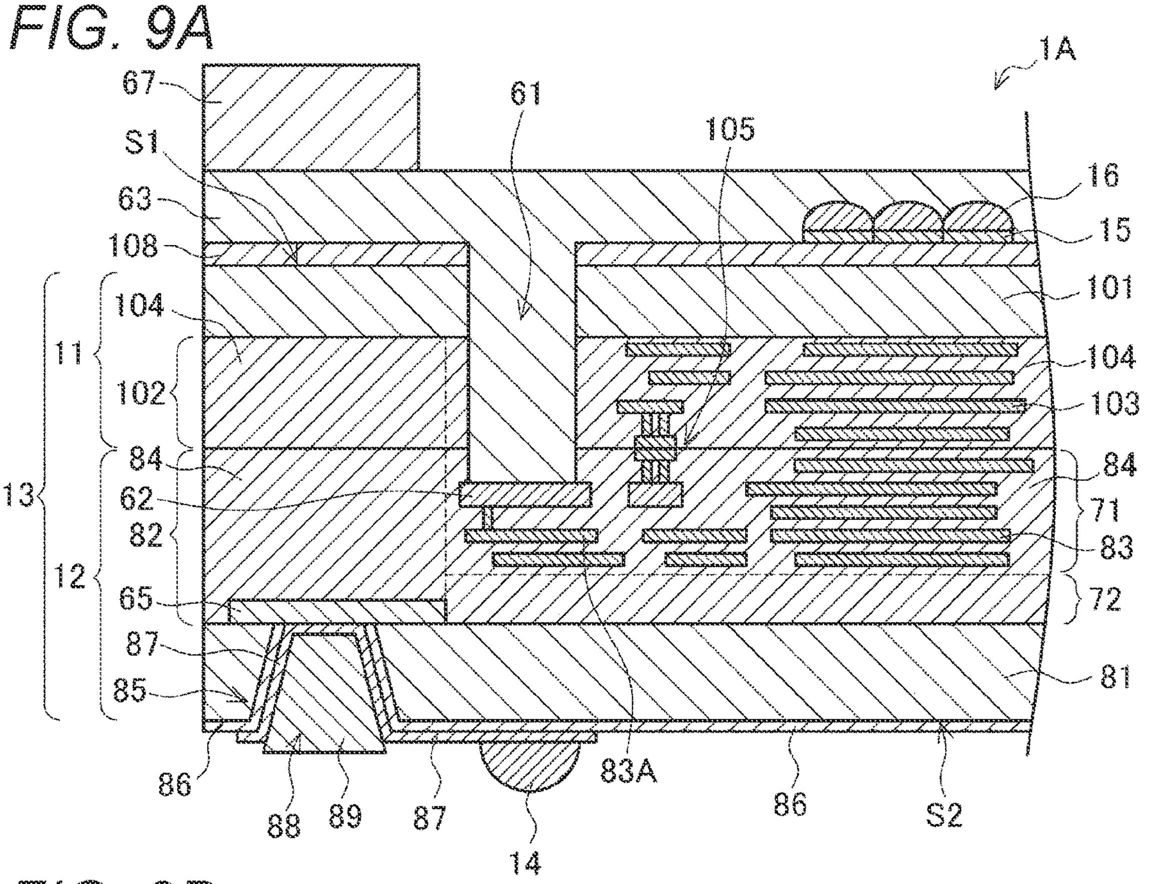
FIG. 9A is a longitudinal cross-sectional view depicting a first modification example of the imaging device according to the embodiment.
Figure 9B:
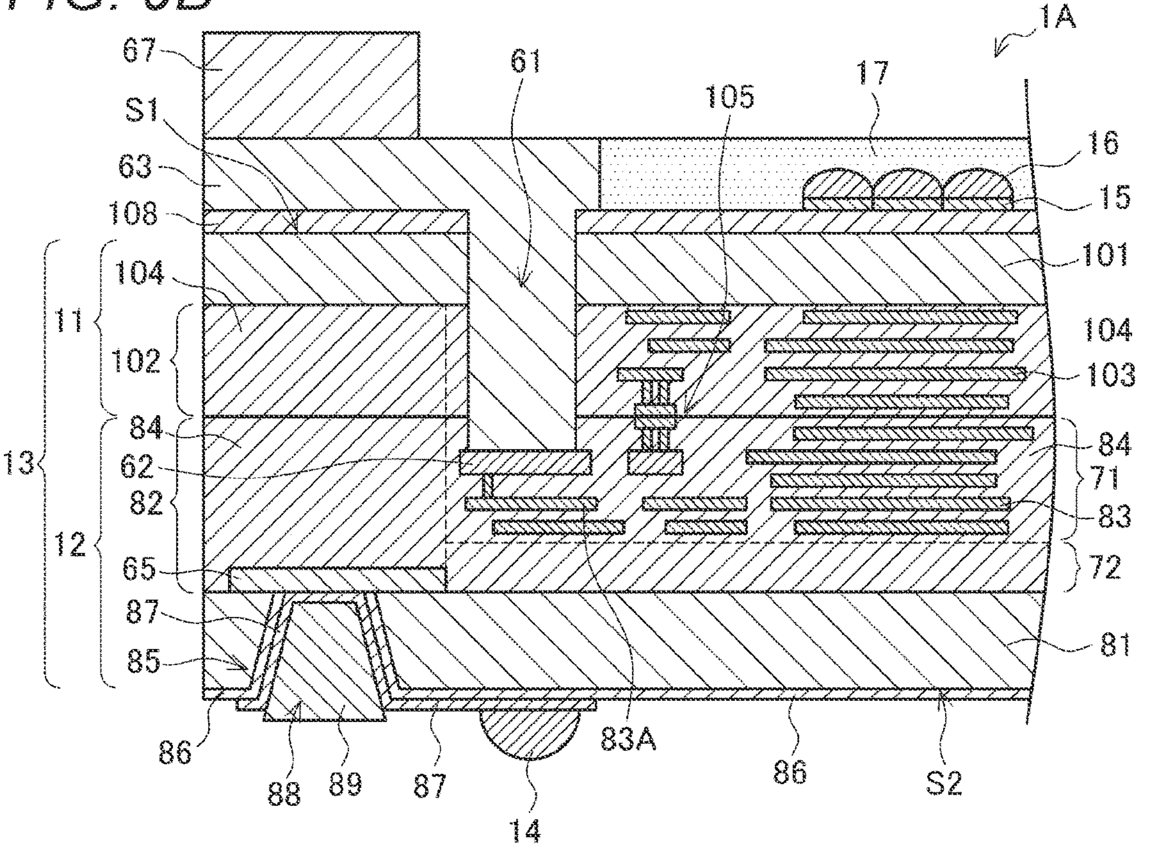
FIG. 9B is a longitudinal cross-sectional view depicting the first modification example of the imaging device according to the embodiment.

FIGS. 9A and 9B are longitudinal cross-sectional views depicting configurations of the imaging device 1A according to the first modification example. As in FIG. 6, FIG. 9A is a longitudinal cross-sectional view of the region of interest MA of the imaging device 1A according to the first modification example. As in FIG. 6, FIG. 9B is a longitudinal cross-sectional view of the region of interest MA of the imaging device 1A according to the first modification example.

As depicted in FIGS. 9A and 9B, the imaging device 1A according to the first modification example is a modification example depicting variations of the structure on the first surface S1 side of the stack 13.

As depicted in FIG. 9A, the color filter 15 and the on-chip lens 16 are provided on the first surface S1 of the stack 13

(that is, the first semiconductor substrate 101) with the planarization film 108 including an insulating material interposed between the first surface S1, and the color filter 15 and the on-chip lens 16. Furthermore, the color filter 15 and the on-chip lens 16 are buried in the buried layer 63 provided all over the first surface S1 of the stack 13 while filling the opening 61. That is, the imaging device 1A according to the first modification example has a so-called cavity-less structure in which no gap (also referred to as cavity) is provided around the color filter 15 and the on-chip lens 16. In such a case, the buried layer 63 may include a transparent resin such as a glass sealing resin so as not to block incident light in the pixel array unit 33.

Note that a reinforcing member 67 may be provided on the buried layer 63 provided in a region other than the pixel array unit 33. The reinforcing member 67 is a planar member having a frame shape in which a region corresponding to the pixel array unit 33 is opened. Specifically, the reinforcing member 67 may be a frame-shaped member that has a planar shape of the same size as the stack 13 and covers the outer peripheral region of the pixel array unit 33. The reinforcing member 67 may include, for example, a rigid member capable of reinforcing the stack 13 such as silicon (Si), glass, plastic, or carbon.

Furthermore, as depicted in FIG. 9B, the buried layer 63 and the glass sealing resin 17 may be provided on the first surface S1 of the stack 13. The buried layer 63 is provided extending over the first surface S1 outside the pixel array unit 33 while filling the opening 61. The glass sealing resin 17 is provided to bury the color filter 15 and the on-chip lens 16 over the first surface S1 of the pixel array unit 33. In such a case, the buried layer 63 is not provided over the first surface S1 of the pixel array unit 33, so that the buried layer 63 may include a colored resin such as a black resin.

With this configuration, the imaging device 1A according to the first modification example can further reduce the size of the stack 13 in the stacking direction thanks to the cavity-less structure. Therefore, the imaging device 1A can constitute a further downsized semiconductor package.

Figure 9C:
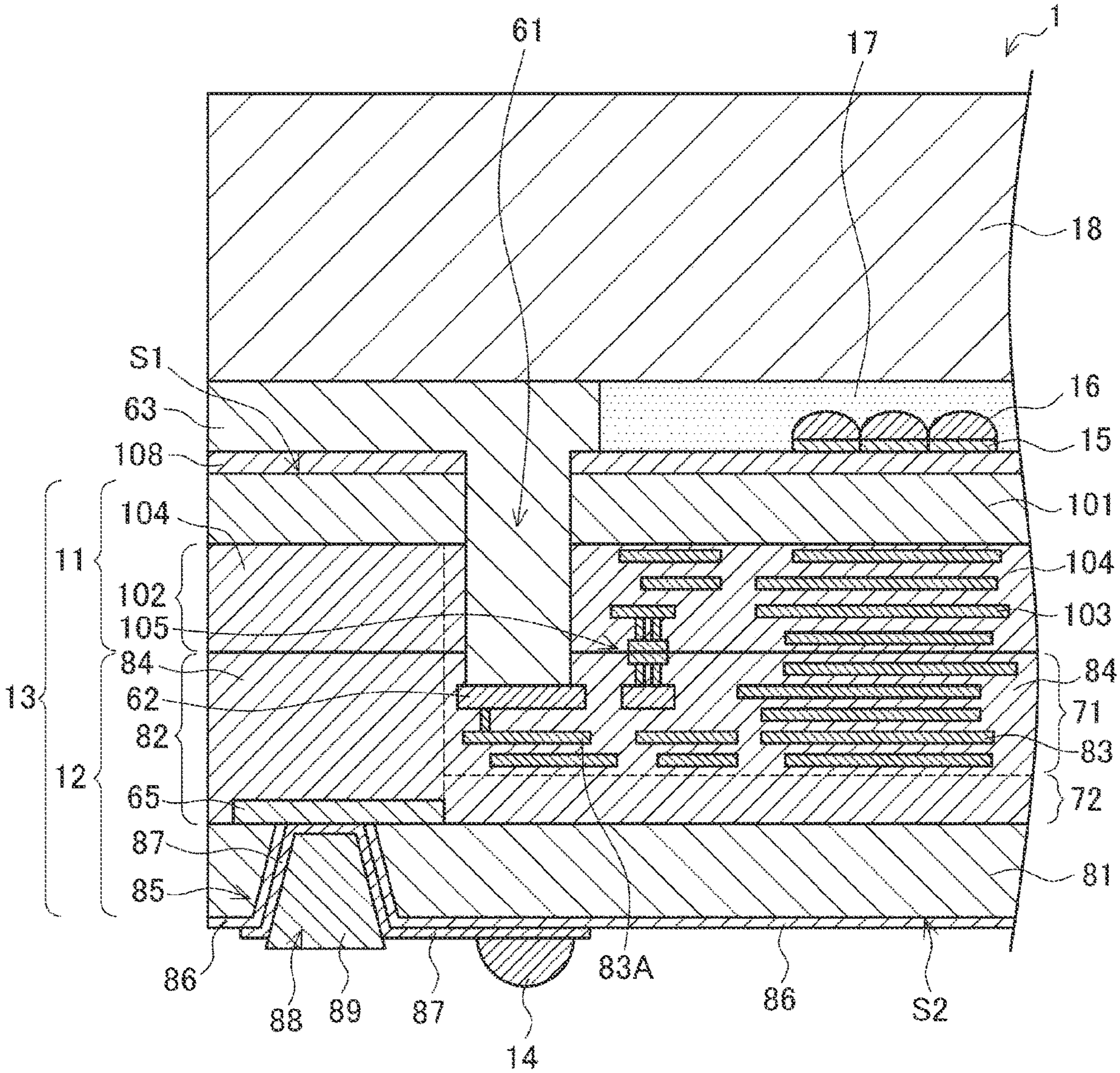
FIG. 9C is a longitudinal cross-sectional view of the imaging device depicted in FIG. 6 having a cavity-less structure.

Note that, in the imaging device 1 having the cavity structure depicted in FIG. 6, the cavity-less structure can be formed by filling the gap 19 with the glass sealing resin 17. Such a structure will be described with reference to FIG. 9C. FIG. 9C is a longitudinal cross-sectional view of the region of interest MA of the imaging device 1 having the cavity-less structure.

As depicted in FIG. 9C, in the imaging device 1 having the cavity-less structure, the glass sealing resin 17 is provided over the first surface S1 of the pixel array unit 33 so as to bury the color filter 15 and the on-chip lens 16. Moreover, the transparent substrate 18 is bonded to the buried layer 63 and the glass sealing resin 17, so that the imaging device 1 is configured as a cavity-less structure in which no gap 19 is present around the color filter 15 and the on-chip lens 16. The technology according to an embodiment of the present disclosure is not particularly limited for the structure on the first surface S1 side of the stack 13, and thus can be applied to either the cavity structure or the cavity-less structure.

Second Modification Example

Figure 10:
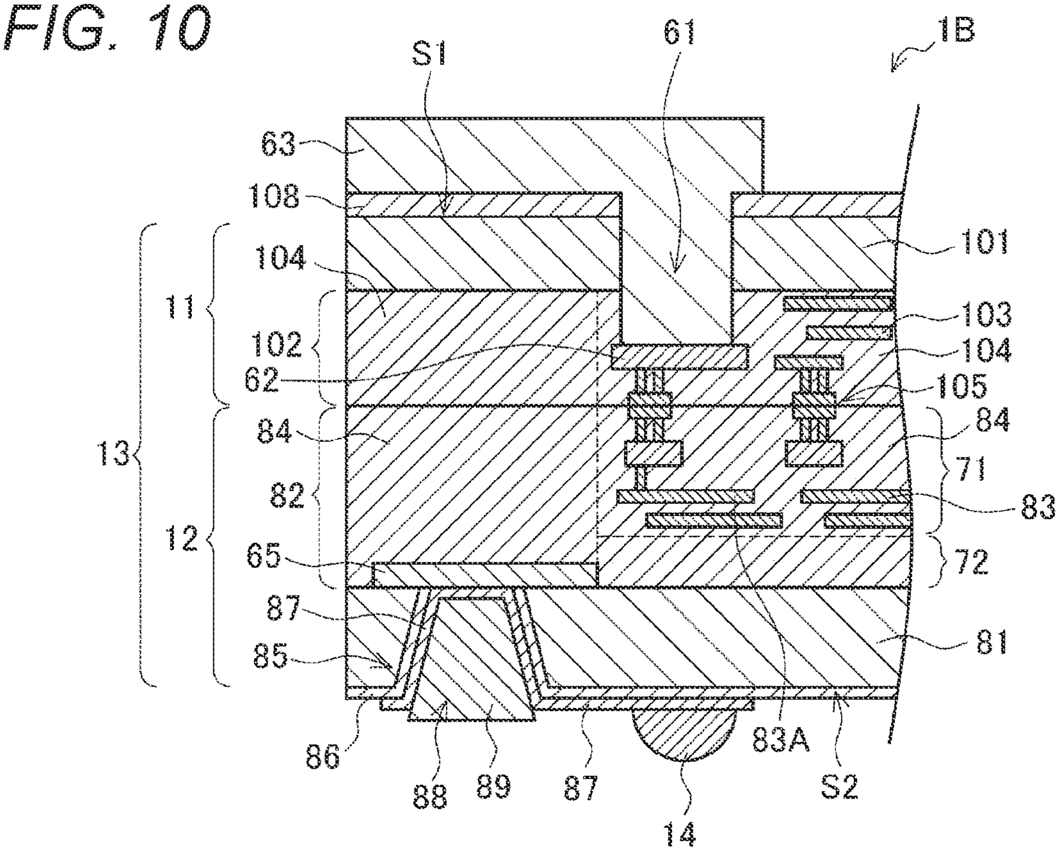
FIG. 10 is a longitudinal cross-sectional view depicting a second modification example of the imaging device according to the embodiment.
Figure 11:
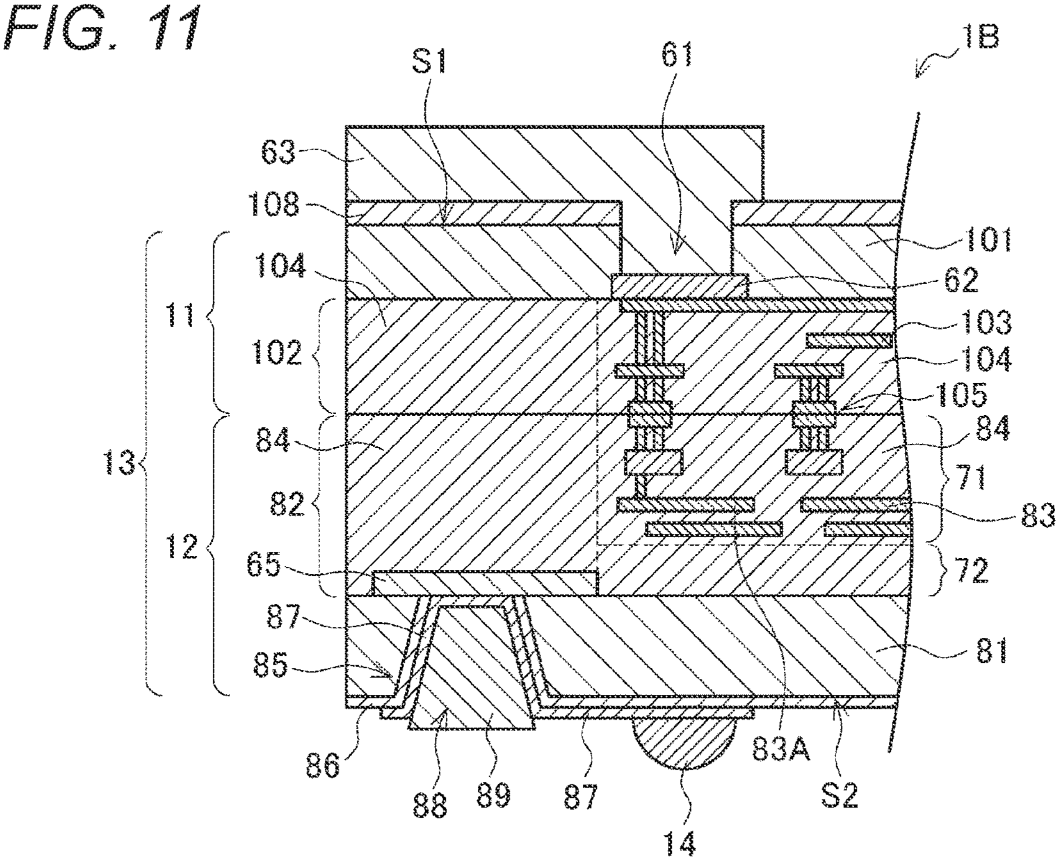
FIG. 11 is a longitudinal cross-sectional view depicting the second modification example of the imaging device according to the embodiment.
Figure 12:
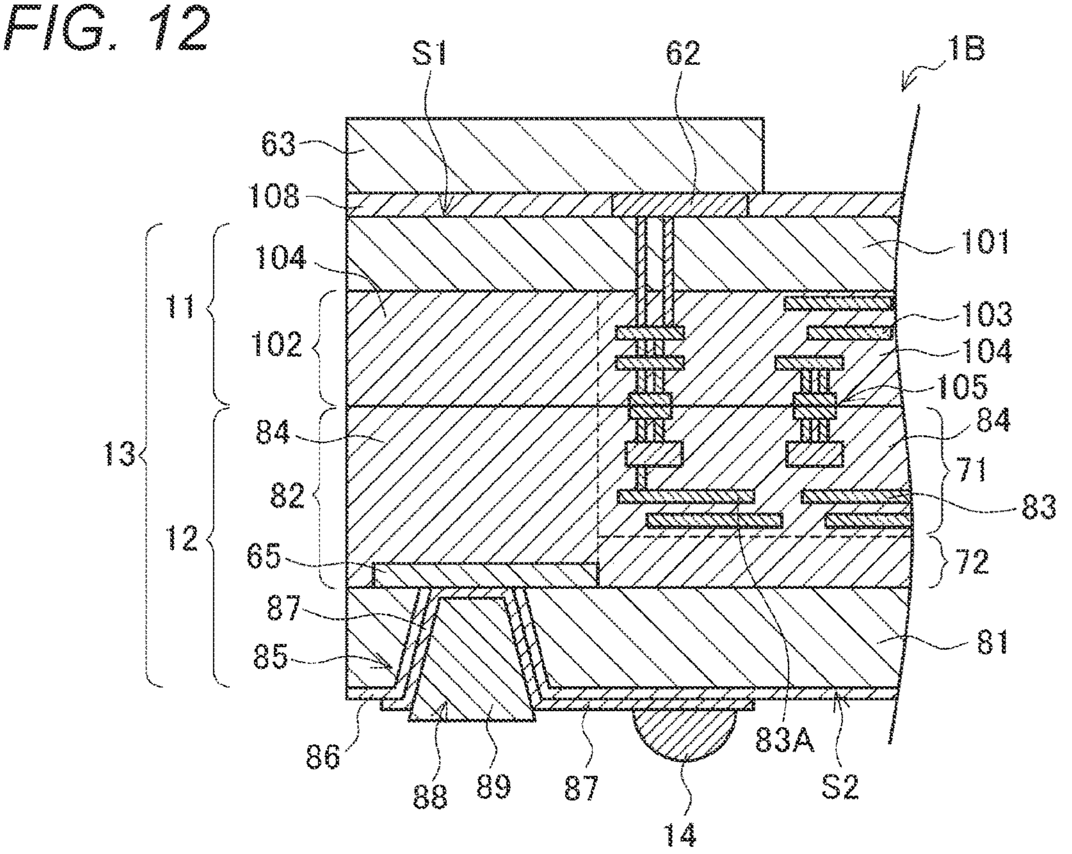
FIG. 12 is a longitudinal cross-sectional view depicting the second modification example of the imaging device according to the embodiment.

FIGS. 10 to 12 are longitudinal cross-sectional views depicting configurations of the imaging device 1B according to the second modification example. FIGS. 10 to 12 are longitudinal cross-sectional views with the pixel array unit 33 omitted from the region of interest MA of the imaging device 1B according to the second modification example.

As depicted in FIGS. 10 to 12, the imaging device 1B according to the second modification example is a modification example depicting variations of the region where the pad electrode 62 is provided in the stack 13.

As depicted in FIG. 10, the pad electrode 62 may include a conductive material such as copper (Cu) or aluminum (Al) and be provided inside the first multilayer wiring layer 102 of the first substrate 11. In such a case, the opening 61 is provided penetrating the planarization film 108 and the first semiconductor substrate 101 from the first surface S1 of the first semiconductor substrate 101 to the first multilayer wiring layer 102, so that the pad electrode 62 provided in the first multilayer wiring layer 102 of the first substrate 11 can be exposed at the bottom of the opening 61.

Furthermore, as depicted in FIG. 11, the pad electrode 62 may include a conductive material such as copper (Cu) or aluminum (Al) and be provided on a surface of the first multilayer wiring layer 102 adjacent to the first semiconductor substrate 101. Note that the pad electrode 62 and the first semiconductor substrate 101 are electrically insulated from each other by an insulating film (not illustrated). In such a case, the opening 61 is provided penetrating the planarization film 108 and the first semiconductor substrate 101 from the first surface S1 of the first semiconductor substrate 101, so that the pad electrode 62 provided on the surface of the first multilayer wiring layer 102 can be exposed at the bottom of the opening 61.

Moreover, as depicted in FIG. 12, the pad electrode 62 may include a conductive material such as copper (Cu) or aluminum (Al) and be provided on the first surface S1 of the first semiconductor substrate 101. Note that the pad electrode 62 and the first semiconductor substrate 101 are electrically insulated from each other by an insulating film (not illustrated). In such a case, the opening 61 is provided penetrating the planarization film 108, so that the pad electrode 62 provided on the first surface S1 of the first semiconductor substrate 101 can be exposed at the bottom of the opening 61.

With this configuration, even in a case where the pad electrode 62 is provided in any region of the stack 13, exposing the pad electrode 62 by the opening 61 allows the probe test to be conducted on the imaging device 1B according to the second modification example. In the imaging device 1B according to the second modification example, as the pad electrode 62 is provided in a region closer to the first surface S1 of the stack 13, it is possible to further reduce the impact, on the through electrode 85, of the stress applied when the probe 120 is pressed against the pad electrode 62 at the time of the probe test.

Third Modification Example

Figure 13:
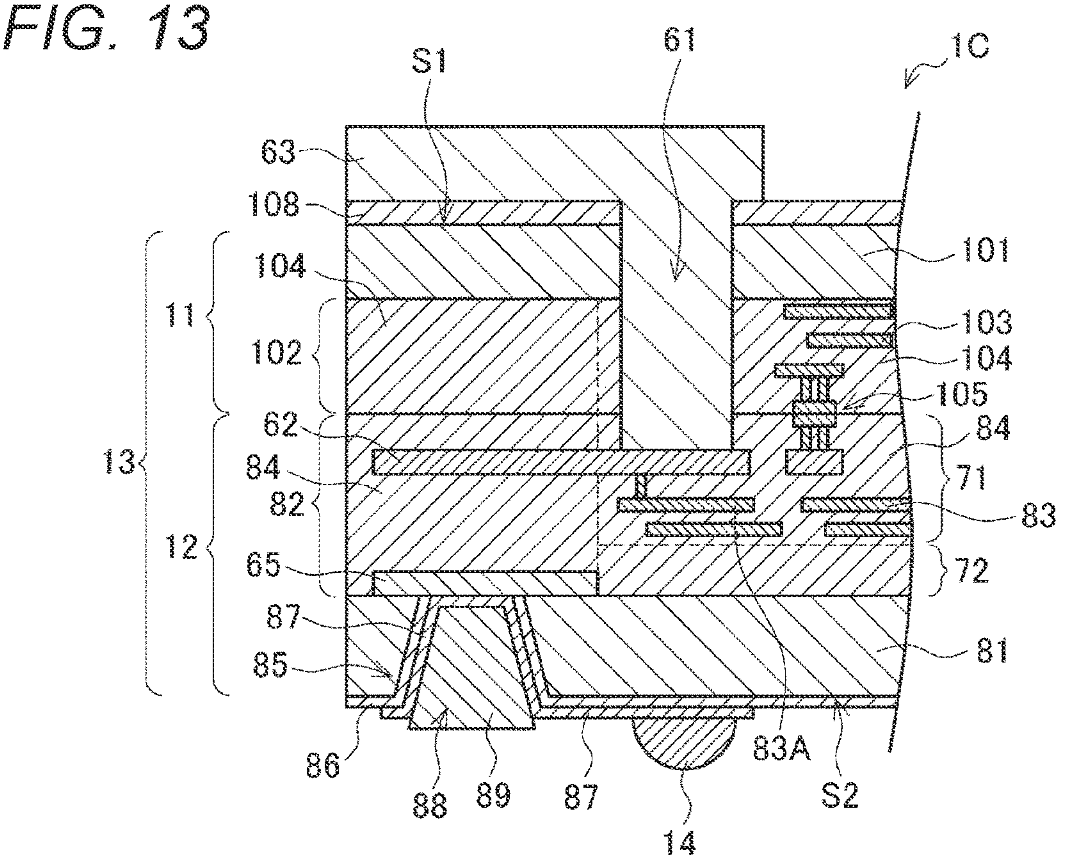
FIG. 13 is a longitudinal cross-sectional view depicting a third modification example of the imaging device according to the embodiment.

FIG. 13 is a longitudinal cross-sectional view depicting a configuration of the imaging device 1C according to the third modification example. FIG. 13 is a longitudinal cross-sectional view with the pixel array unit 33 omitted from the region of interest MA of the imaging device 1C according to the third modification example.

As depicted in FIG. 13, the imaging device 1C according to the third modification example is a modification example depicting variations of the planar region where the pad electrode 62 is provided.

Specifically, the pad electrode 62 may be provided extending from the bottom of the opening 61 to the planar region where the through electrode 85 is provided. The pad electrode 62 may be provided in any planar region as long as the pad electrode 62 is provided at least in a planar region different from the planar region where the through electrode 85 is provided. The planar region where the pad electrode 62 is provided different from the planar region where the through electrode 85 is provided, however, is exposed by the opening 61 at the time of the probe test. For example, the pad electrode 62 may be provided extending over both the planar region where the opening 61 is provided and the planar region where the through electrode 85 is provided.

With this configuration, the imaging device 1C according to the third modification example can flexibly change the planar region where the opening 61 is provided. This is because, depending on the position where the opening 61 is provided, incident light reflected off a side surface, over the first surface S1, the buried layer 63 filling the opening 61 impinges on an unintended pixel 32 of the pixel array unit 33, and a flare appears in a captured image. Therefore, the imaging device 1C can flexibly change, by providing the pad electrode 62 over a wider planar region, the position of the opening 61 so as to form the side surface of the buried layer 63 at a position that prevents a flare from appearing.

3. Derived Example

Next, a derived example of the imaging device 1 according to the present embodiment will be described with reference to FIGS. 14 to 18. A structure that produces other effects can be derived from the imaging device 1 according to the present embodiment by changing a part of the structure depicted in FIG. 13.

First Derived Example

Figure 14:
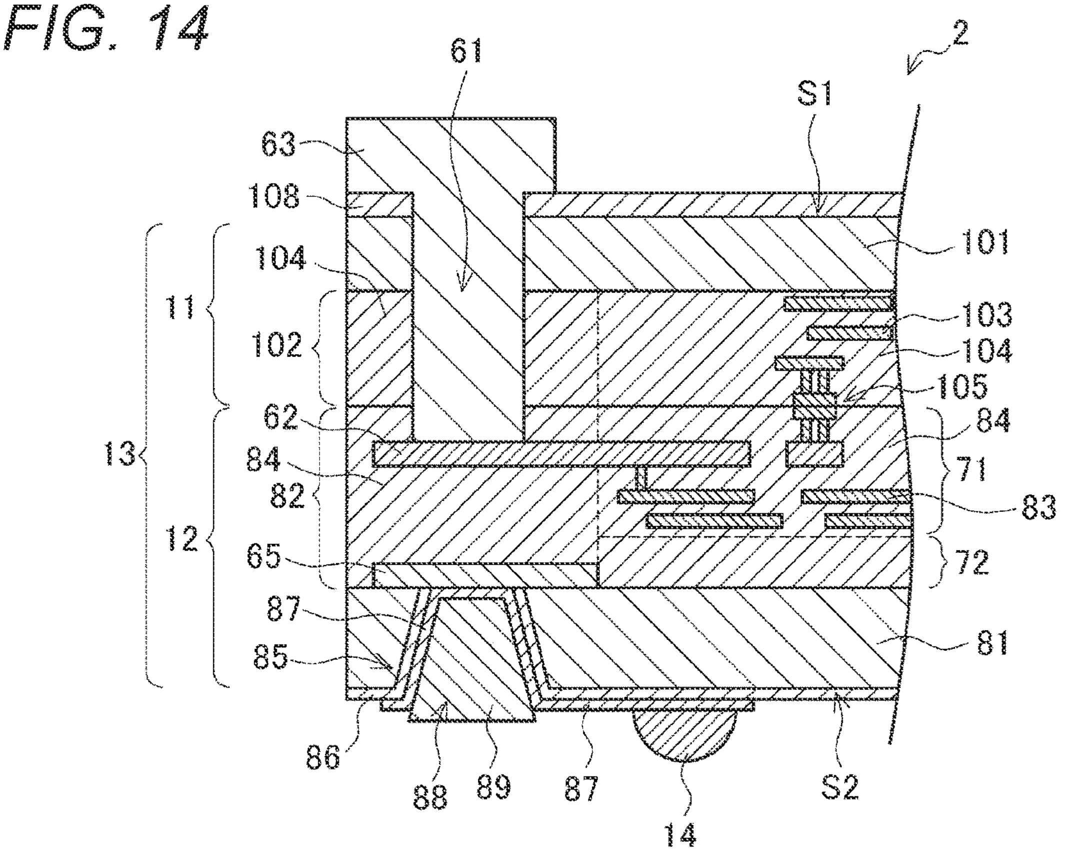
FIG. 14 is a longitudinal cross-sectional view depicting a first derived example of the imaging device according to the embodiment.

FIG. 14 is a longitudinal cross-sectional view depicting an imaging device 2 according to a first derived example. As depicted in FIG. 14, in the imaging device 2 according to the first derived example, the pad electrode 62 is provided extending over both the planar region different from the planar region where the through electrode 85 is provided and the planar region where the through electrode 85 is provided, and the opening 61 is provided in the planar region overlapping the planar region where the through electrode 85 is provided. Note that other configurations are substantially similar to those of the imaging device 1C depicted in FIG. 13, and thus the description thereof will be omitted here.

In such a case, the imaging device 2 can provide the opening 61 at a position farther away from the pixel array unit 33, so that the side surface of the buried layer 63 provided over the first surface S1 of the stack 13 can be provided at a position farther away from the pixel array unit 33. With this configuration, the imaging device 2 according to the first derived example can prevent the incident light reflected off the side surface of the buried layer 63 provided over the first surface S1 of the stack 13 from impinging on an unintended pixel 32, so that it is possible to prevent a flare from appearing in a captured image.

Second Derived Example

Figure 15:
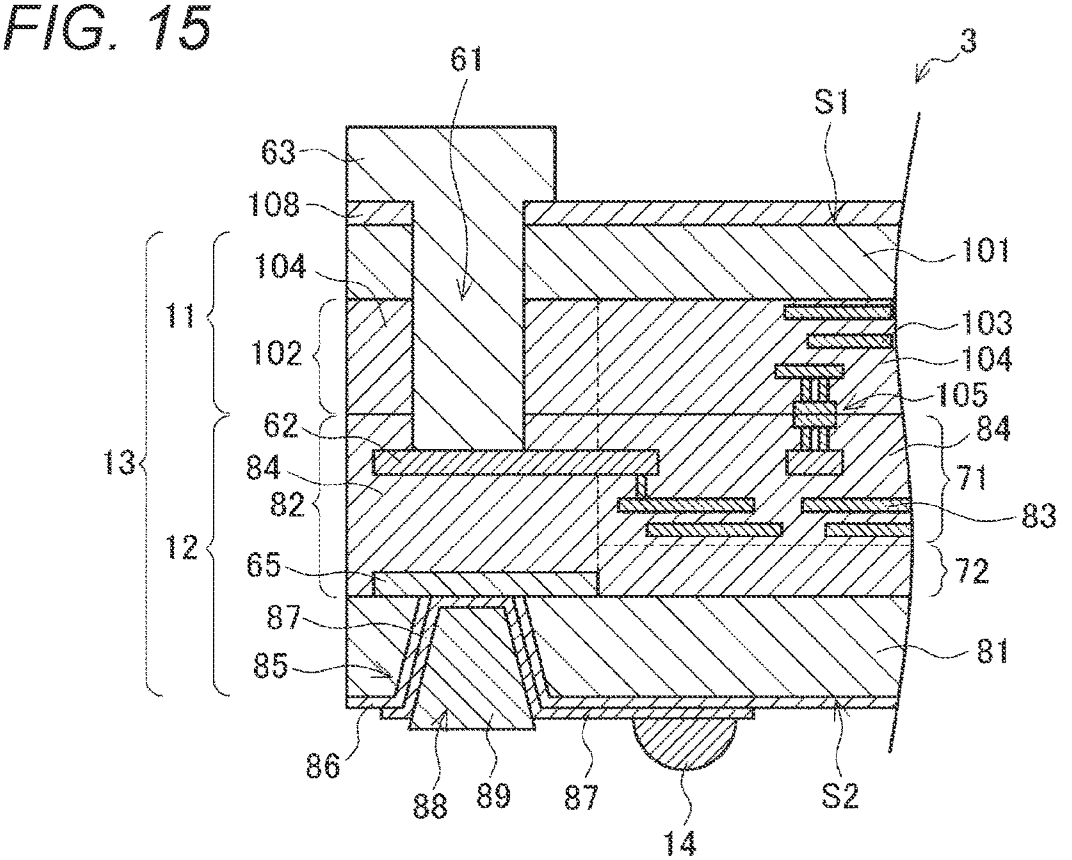
FIG. 15 is a longitudinal cross-sectional view illustrating a second derived example of the imaging device according to the embodiment.

FIG. 15 is a longitudinal cross-sectional view depicting an imaging device 3 according to a second derived example. As depicted in FIG. 15, in the imaging device 3 according to the second derived example, the pad electrode 62 is provided extending over only the planar region where the through electrode 85 is provided, and the opening 61 is provided in the planar region overlapping the planar region where the through electrode 85 is provided. Note that other configurations are substantially similar to those of the imaging device 1C depicted in FIG. 13, and thus the description thereof will be omitted here.

In such a case, the imaging device 3 can provide the opening 61 at a position farther away from the pixel array unit 33, so that the side surface of the buried layer 63 provided over the first surface S1 of the stack 13 can be provided at a position farther away from the pixel array unit 33. With this configuration, the imaging device 3 according to the second derived example can prevent the incident light reflected off the side surface of the buried layer 63 provided over the first surface S1 of the stack 13 from impinging on an unintended pixel 32, so that it is possible to prevent a flare from appearing in a captured image.

Furthermore, the imaging device 3 can make the planar region where the pad electrode 62 is provided small, as compared with the imaging device 2 according to the first derived example. Therefore, the imaging device 3 according to the second derived example can reduce parasitic capacitance caused by the pad electrode 62, so that signal noise and signal delay can be reduced.

Third Derived Example

Figure 16:
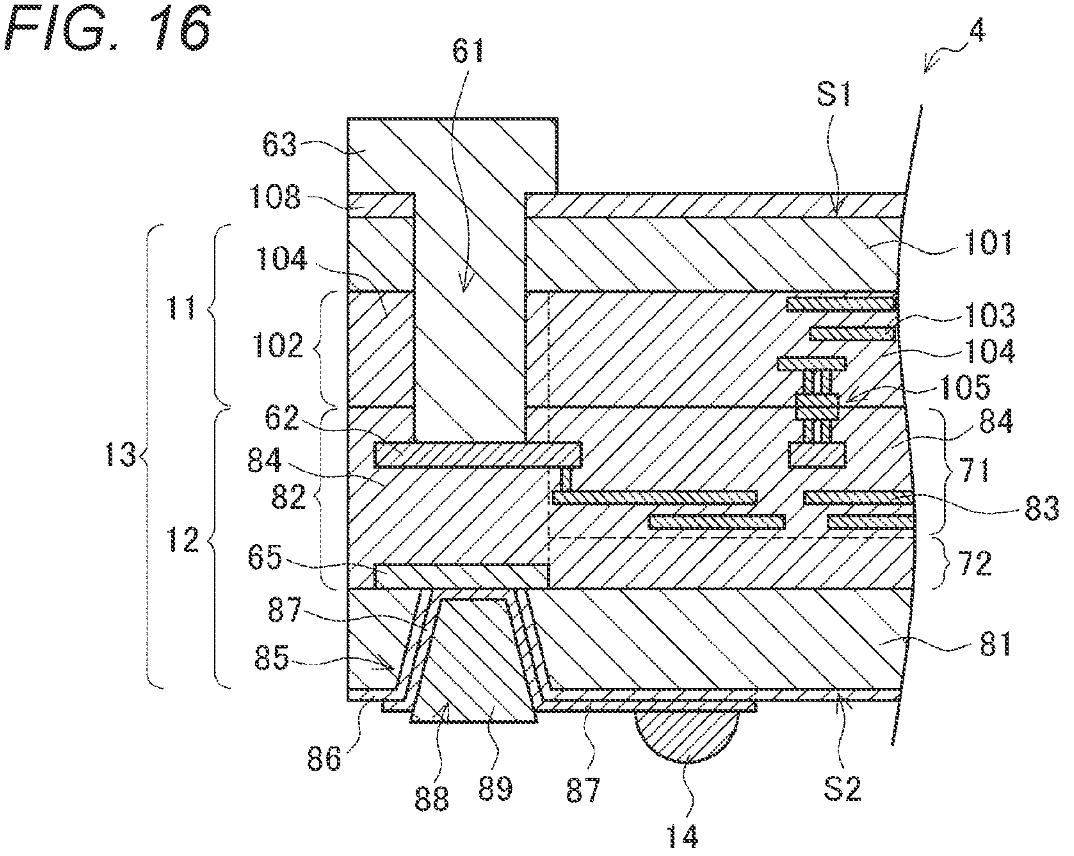
FIG. 16 is a longitudinal cross-sectional view depicting a third derived example of the imaging device according to the embodiment.

FIG. 16 is a longitudinal cross-sectional view depicting an imaging device 4 according to a third derived example. As depicted in FIG. 16, in the imaging device 4 according to the third derived example, the pad electrode 62 is provided extending over only the planar region where the through electrode 85 is provided, and the opening 61 is provided in the planar region overlapping the planar region where the through electrode 85 is provided. Furthermore, the pad electrode 62 and the wiring layer 65 are provided only in the planar region overlapping the planar region where the through electrode 85 is provided. Note that other configurations are substantially similar to those of the imaging device 1C depicted in FIG. 13, and thus the description thereof will be omitted here.

In such a case, the imaging device 4 can provide the opening 61 at a position farther away from the pixel array unit 33, so that the side surface of the buried layer 63 provided over the first surface S1 of the stack 13 can be provided at a position farther away from the pixel array unit 33. With this configuration, the imaging device 4 according to the third derived example can prevent the incident light reflected off the side surface of the buried layer 63 provided over the first surface S1 of the stack 13 from impinging on an unintended pixel 32, so that it is possible to prevent a flare from appearing in a captured image.

Furthermore, the imaging device 4 according to the third derived example can make the planar region where the pad electrode 62 is provided small, as compared with the imaging device 2 according to the first derived example and the imaging device 3 according to the second derived example. Therefore, the imaging device 4 according to the third derived example can reduce parasitic capacitance caused by the pad electrode 62, so that signal noise and signal delay can be reduced.

Moreover, the imaging device 4 according to the third derived example can make the planar region where the wiring layer 65 electrically connected to the through electrode 85 is provided small, as compared with the imaging device 2 according to the first derived example and the imaging device 3 according to the second derived example. Therefore, the imaging device 4 according to the third derived example can make the planar region that can be used by the wiring layer 83 included in the second multilayer wiring layer 82 larger, so that it is possible to set the layout of the wiring layer 83 more flexibly.

Fourth Derived Example

Figure 17:
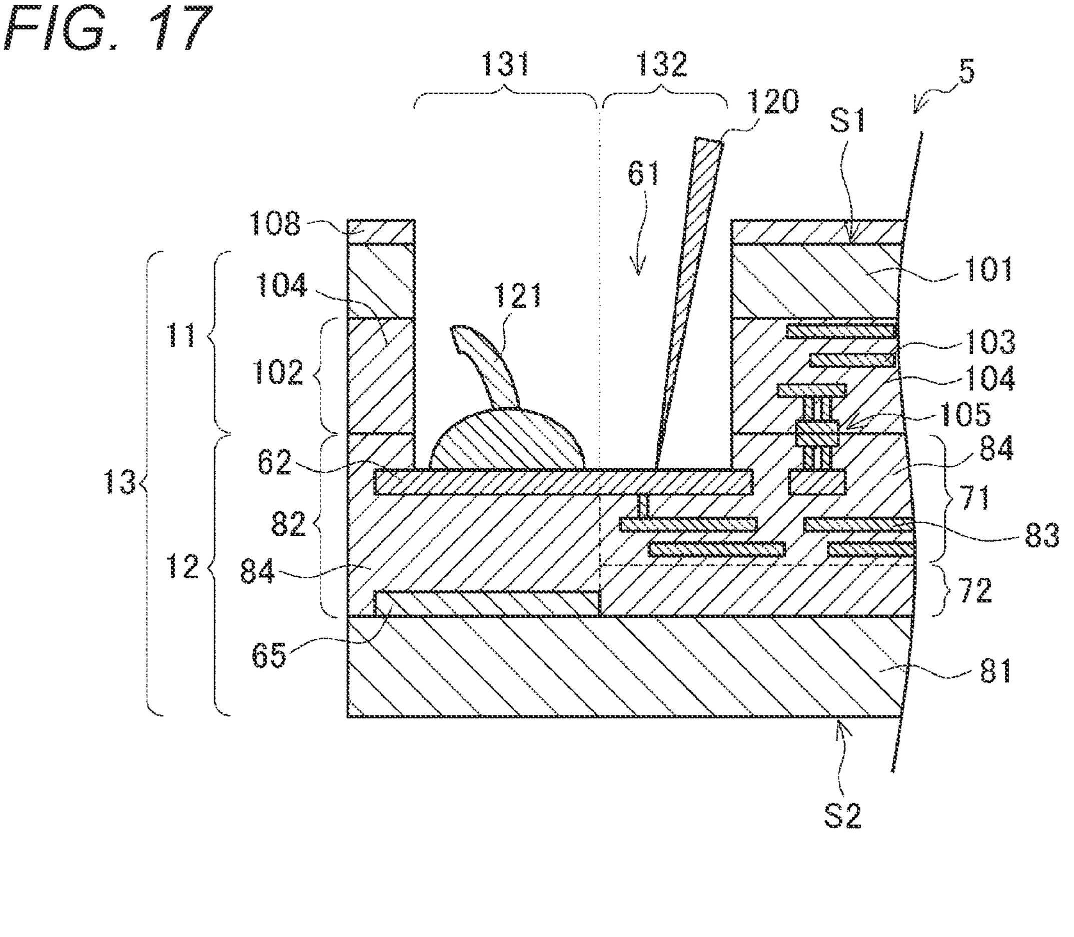
FIG. 17 is a longitudinal cross-sectional view depicting a fourth derived example of the imaging device according to the embodiment.

FIG. 17 is a longitudinal cross-sectional view depicting an imaging device 5 according to a fourth derived example. As depicted in FIG. 17, in the imaging device 5 according to the fourth derived example, the pixel signal subjected to signal processing in various circuits inside the stack 13 is output to the outside through a bonding wire 121 connected to the pad electrode 62 instead of the through electrode 85.

Specifically, the pad electrode 62 is provided extending over both the planar region where the through electrode 85 is provided in the imaging device 1C depicted in FIG. 13 (that is, in FIG. 17, the planar region where the wiring layer 65 is provided) and the planar region different from the planar region where the through electrode 85 is provided. The opening 61 is provided in the planar region corresponding to the planar region where the pad electrode 62 is provided to expose all of the pad electrode 62. The pad electrode 62 includes a connection region 131 to which the bonding wire 121 is connected, and a test region 132 against which the probe 120 is pressed at the time of the probe test. Note that other configurations are substantially similar to those of the imaging device 1C depicted in FIG. 13, and thus the description thereof will be omitted here.

The imaging device 5 according to the fourth derived example can be mounted on an external substrate (not illustrated) using the bonding wire 121 instead of the through electrode 85. Furthermore, in the imaging device 5 according to the fourth derived example, the pad electrode 62 can be divided into the connection region 131 to which the bonding wire 121 is connected and the test region 132 against which the probe 120 is pressed at the time of the probe test. With this configuration, the imaging device 5 according to the fourth derived example can prevent the reliability of the connection of the bonding wire 121 from deteriorating due to an indentation formed by the probe 120 at the time of the probe test.

Fifth Derived Example

Figure 18:
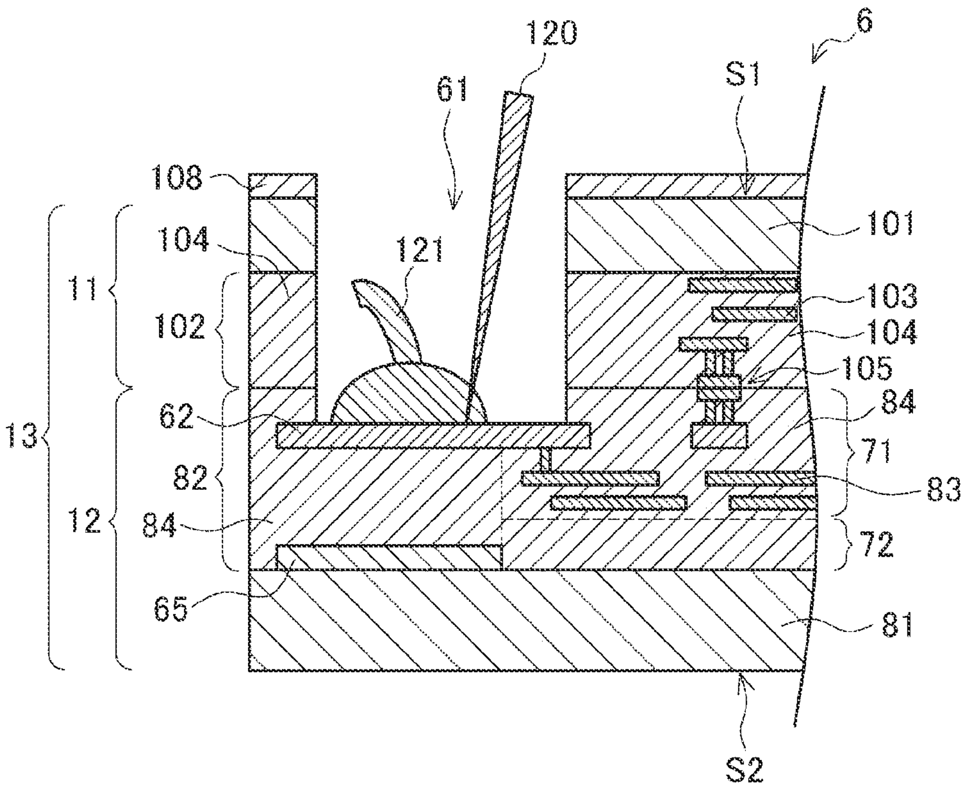
FIG. 18 is a longitudinal cross-sectional view depicting a fifth derived example of the imaging device according to the embodiment.

FIG. 18 is a longitudinal cross-sectional view depicting an imaging device 6 according to a fifth derived example. As depicted in FIG. 18, in the imaging device 6 according to the fifth derived example, the pixel signal subjected to signal processing in various circuits inside the stack 13 is output to the outside through the bonding wire 121 connected to the pad electrode 62 instead of the through electrode 85. Furthermore, in the imaging device 6 according to the fifth derived example, the planar region where the pad electrode 62 and the opening 61 are provided is made small as compared with the imaging device 5 according to the fourth derived example.

Specifically, the pad electrode 62 is provided extending over both the planar region where the through electrode 85 is provided in the imaging device 1C depicted in FIG. 13 (that is, in FIG. 17, the planar region where the wiring layer 65 is provided) and the planar region different from the planar region where the through electrode 85 is provided. The opening 61 is provided in the planar region corresponding to the planar region where the pad electrode 62 is provided to expose all of the pad electrode 62. However, in the pad electrode 62, the bonding wire 121 is connected to the same region as the region where the probe 120 is pressed at the time of the probe test. Note that other configurations are substantially similar to those of the imaging device 1C depicted in FIG. 13, and thus the description thereof will be omitted here.

The imaging device 6 according to the fifth derived example can be mounted on an external substrate (not illustrated) using the bonding wire 121 rather than the through electrode 85. Furthermore, in the imaging device 6 according to the fifth derived example, the planar region where the pad electrode 62 is provided can be made small as compared with the imaging device 5 according to the fourth derived example. Therefore, the imaging device 6 according to the fifth derived example can reduce parasitic capacitance caused by the pad electrode 62, so that signal noise and signal delay can be reduced.

The imaging devices according to the first to fifth derived examples described above can share a part of the structure and a part of the manufacturing process with the imaging device 1C depicted in FIG. 13. Therefore, the imaging device 1 according to the present embodiment or derivatives of the imaging device 1 can be applied to imaging devices having a wider variety of structures.

4. Electronic Device

Figure 19:
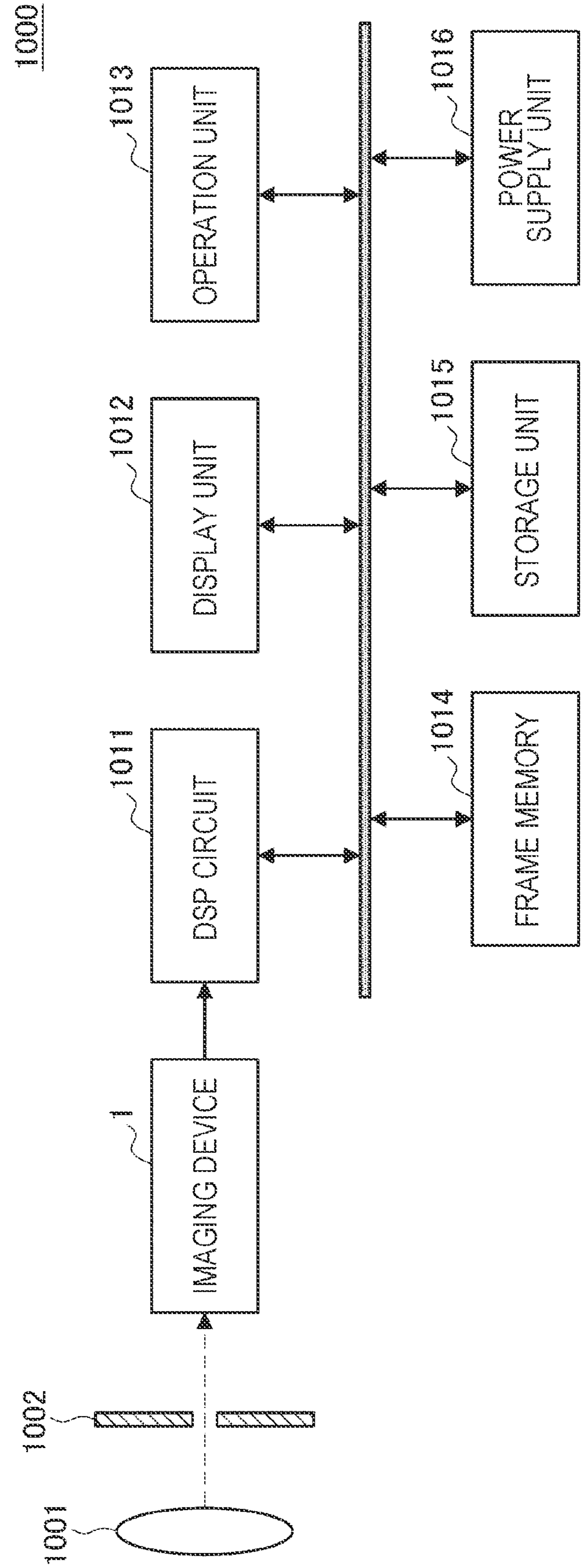
FIG. 19 is a block diagram depicting a configuration example of an electronic device including the imaging device according to the embodiment.

Next, a configuration of an electronic device including the imaging device 1 according to the present embodiment will be described with reference to FIG. 19. FIG. 19 is a block diagram illustrating a configuration example of an electronic device 1000 including the imaging device 1 according to the present embodiment. For example, the electronic device 1000 may be a general electronic device using an imaging device as an image capturing unit (photoelectric conversion unit), such as an imaging device such as a digital camera or a video camera, a mobile terminal device having an imaging function, or a copying machine using an imaging device as an image reading unit. The imaging device 1 may be mounted on the electronic device 1000 as a single chip, or may be mounted on the electronic device 1000 as a module having an imaging function in which an imaging unit and a signal processing unit or an optical system are packaged together.

As depicted in FIG. 19, the electronic device 1000 includes an optical lens 1001, a shutter device 1002, the imaging device 1, a digital signal processor (DSP) circuit 1011, a frame memory 1014, a display unit 1012, a storage unit 1015, an operation unit 1013, and a power supply unit 1016. The DSP circuit 1011, the frame memory 1014, the display unit 1012, the storage unit 1015, the operation unit 1013, and the power supply unit 1016 are connected to one another via a bus line 1017.

The optical lens 1001 forms an image of incident light from a subject on an imaging surface of the imaging device 1. The shutter device 1002 controls a light irradiation period and a light shielding period for the imaging device 1.

The imaging device 1 converts the light amount of the incident light formed as an image on the imaging surface by the optical lens 1001 into an electrical signal in units of pixels and outputs the electrical signal as a pixel signal.

The DSP circuit 1011 is a signal processing circuit that performs general camera signal processing on the pixel signal output from the imaging device 1. The DSP circuit 1011 may perform, for example, a white balance process, a demosaic process, a gamma correction process, or the like.

The frame memory 1014 is a temporary data storage unit. The frame memory 1014 is appropriately used for storing data during signal processing in the DSP circuit 1011.

The display unit 1012 includes, for example, a panel type display device such as a liquid crystal panel or an organic electro luminescence (EL) panel. The display unit 1012 can display a moving image or a still image captured by the imaging device 1.

The storage unit 1015 records a moving image or a still image captured by the imaging device 1 in a storage medium such as a hard disk drive, an optical disc, or a semiconductor memory.

The operation unit 1013 issues operation commands for various functions of the electronic device 1000 on the basis of a user's operation.

The power supply unit 1016 is an operation power supply of the DSP circuit 1011, the frame memory 1014, the display unit 1012, the storage unit 1015, and the operation unit 1013. The power supply unit 1016 can appropriately supply power to these supply targets.

5. Application Example

Application Example to Mobile Body

The technology according to an embodiment of the present disclosure (present technology) is applicable to various products. For example, the technology according to an embodiment of the present disclosure may be implemented as a device mounted on any type of mobile body such as an automobile, an electric vehicle, a hybrid electric vehicle, a motorcycle, a bicycle, a personal mobility, an airplane, a drone, a ship, or a robot.

Figure 20:
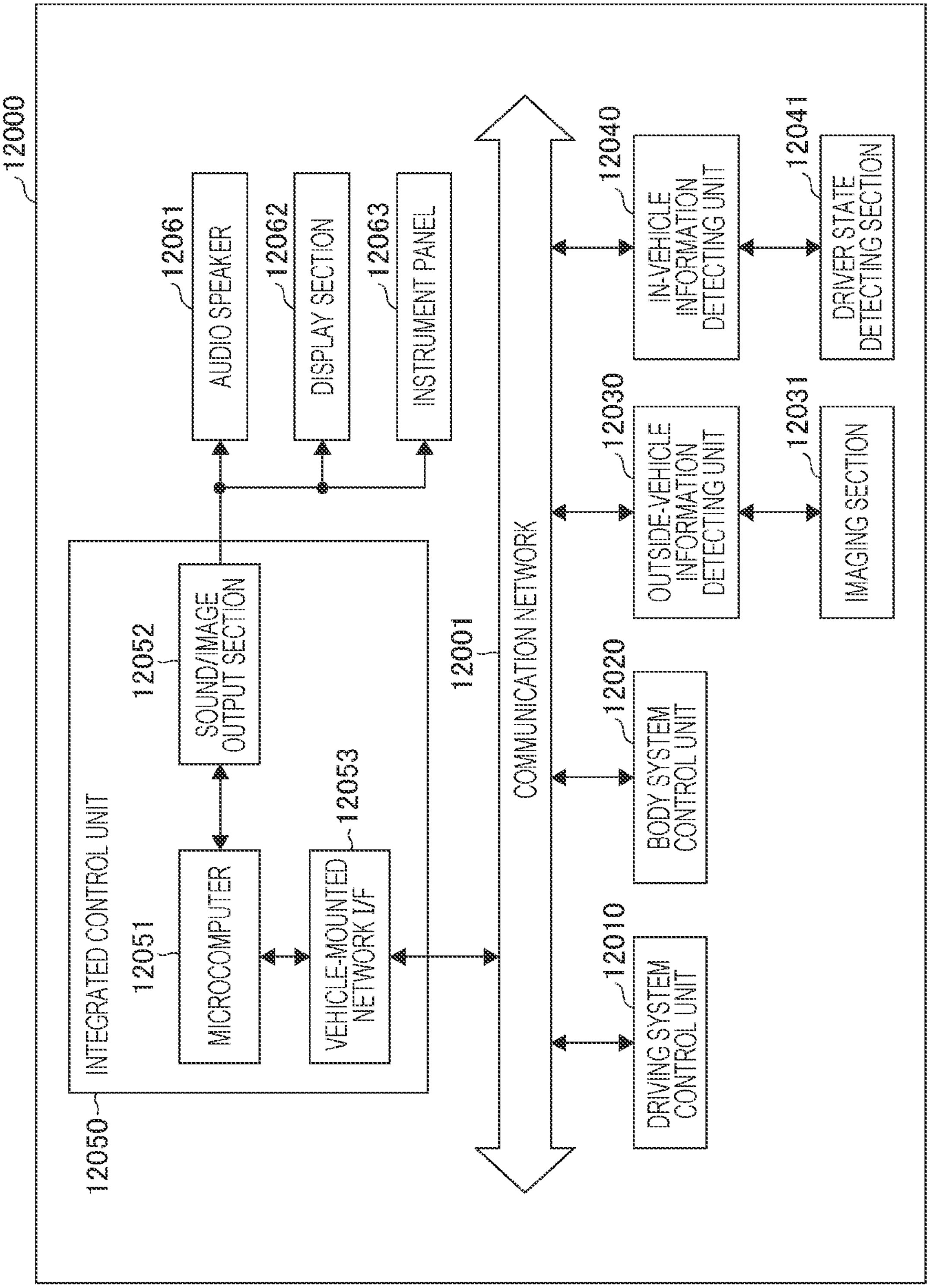
FIG. 20 is a block diagram depicting an example of a schematic configuration of a vehicle control system.

FIG. 20 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 20, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle acquired by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 20, an audio speaker 12061, a display section 12062, and an instrument panel 12063 are illustrated as the output device. The display section 12062 may, for example, include at least one of an on-board display and a head-up display.

Figure 21:
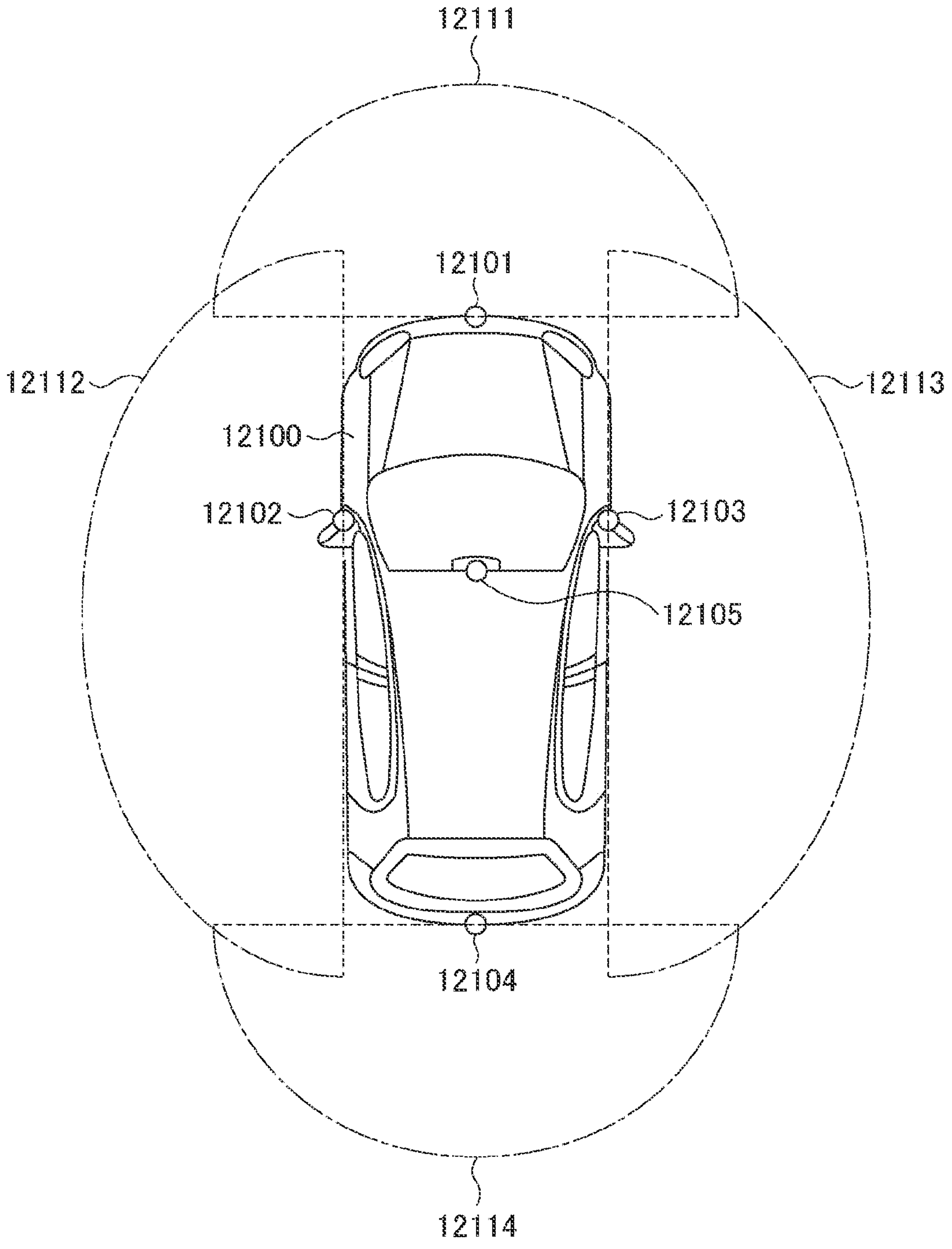
FIG. 21 is a diagram of assistance in explaining an example of installation positions of an outside-vehicle information detecting section and an imaging section.

FIG. 21 is a diagram depicting an example of the installation position of the imaging section 12031.

In FIG. 21, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 21 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to an embodiment of the present disclosure can be applied has been described above. The technology according to an embodiment of the present disclosure can be applied to the imaging section 12031 among the configurations described above. The application of the technology according to an embodiment of the present disclosure to the imaging section 12031 allows an improvement in reliability of the imaging section 12031, so that it is possible to reduce the occurrence of an error caused by the imaging section 12031 in the vehicle control system, for example.

Application Example to Endoscopic Surgery System

The technology according to an embodiment of the present disclosure (present technology) is applicable to various products. For example, the technology according to an embodiment of the present disclosure may be applied to an endoscopic surgery system.

Figure 22:
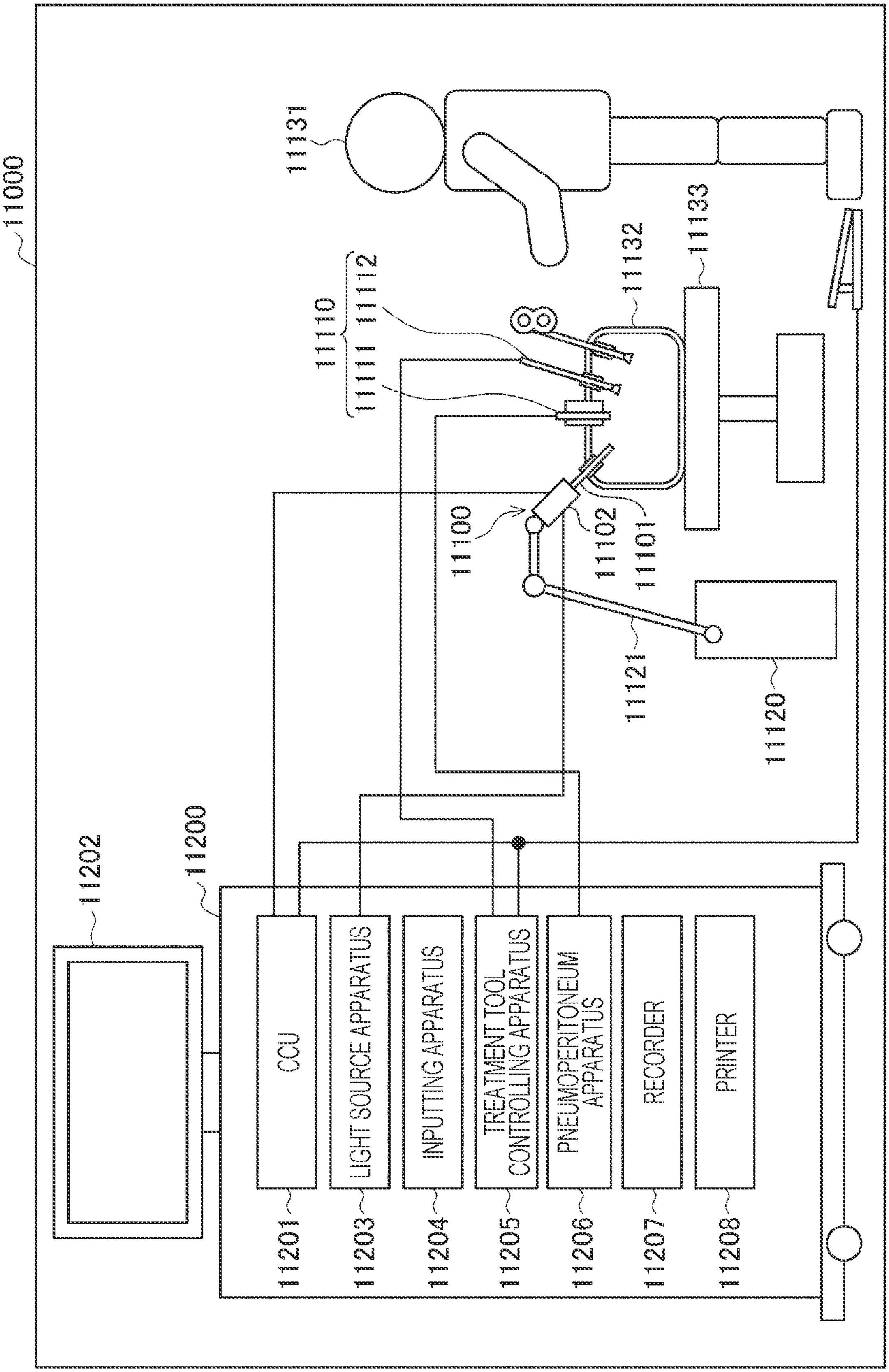
FIG. 22 is a view depicting an example of a schematic configuration of an endoscopic surgery system.

FIG. 22 is a view depicting an example of a schematic configuration of an endoscopic surgery system to which the technology according to an embodiment of the present disclosure (present technology) can be applied.

In FIG. 22, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 23:
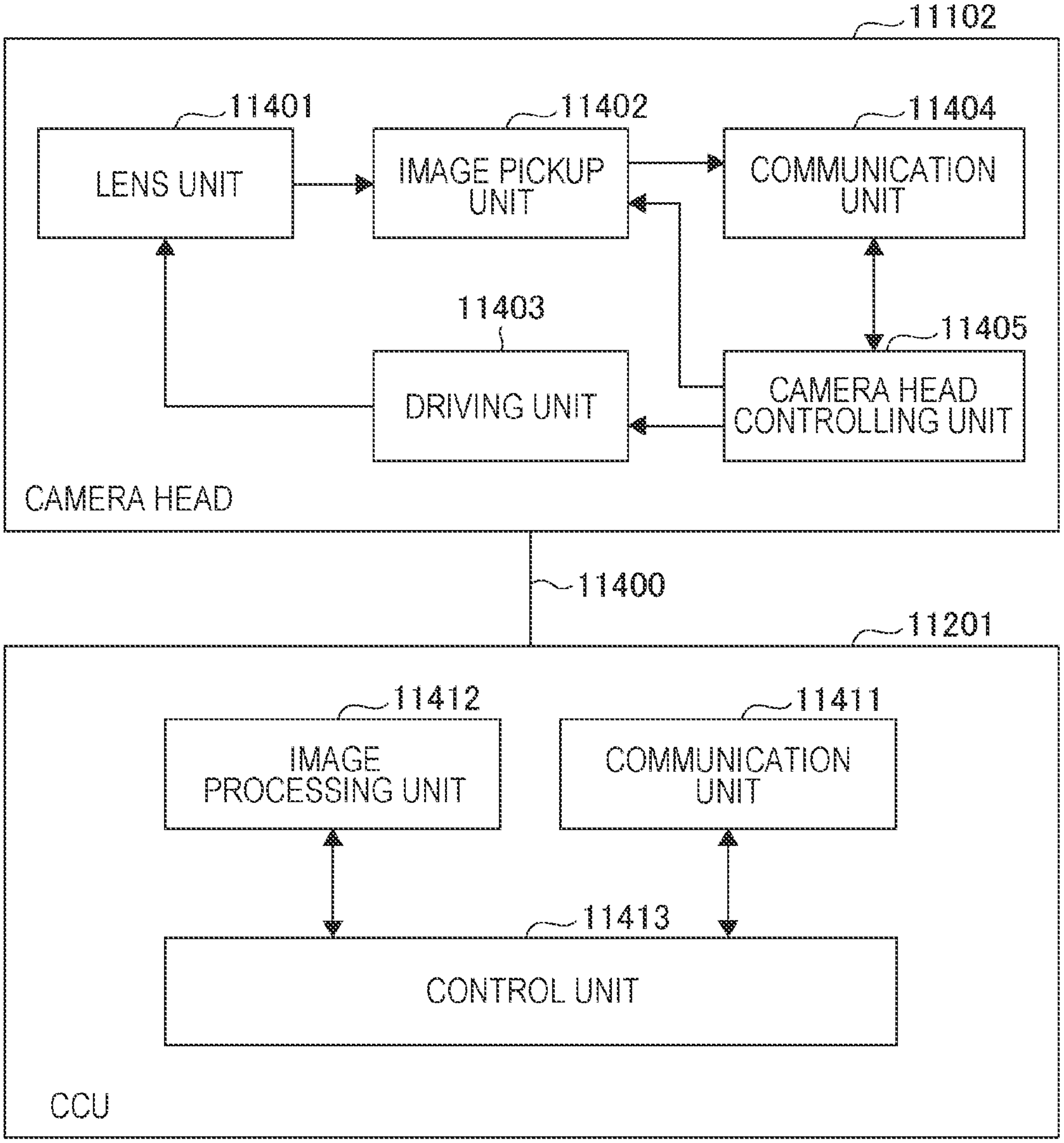
FIG. 23 is a block diagram depicting an example of a functional configuration of a camera head and a camera control unit (CCU).

FIG. 23 is a block diagram depicting an example of a functional configuration of the camera head 11102 and the CCU 11201 depicted in FIG. 22.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to an embodiment of the present disclosure can be applied has been described above. The technology according to an embodiment of the present disclosure can be applied to, for example, the endoscope 11100, the image pickup unit 11402 of the camera head 11102, and the like among the configurations described above. The application of the technology according to an embodiment of the present disclosure to the image pickup unit 11402 allows an improvement in reliability of the image pickup unit 11402, so that it is possible to reduce the occurrence of an error caused by the image pickup unit 11402 in the endoscopic surgery system, for example.

Note that, here, the endoscopic surgery system has been described as an example, but the technology according to an embodiment of the present disclosure may be applied to, for example, a microscopic surgery system or the like.

The preferred embodiments of the present disclosure have been described above in detail with reference to the accompanying drawings, but the technical scope of the present disclosure is not limited to such examples. It is obvious that those with ordinary skill in the technical field of the present disclosure may conceive various modifications or corrections within the scope of the technical idea recited in claims, and it is naturally understood that they also fall within the technical scope of the present disclosure.

For example, in the above-described embodiments, the imaging device has been described as a specific example of the semiconductor device, but the technology according to an embodiment of the present disclosure is not limited to the above-described examples. For example, the technology according to an embodiment of the present disclosure can also be applied to a semiconductor device including a light detection device such as a time of flight (ToF) sensor, a semiconductor storage device such as a semiconductor memory, a logic operation device such as a CMOS circuit, or the like.

Furthermore, the effects described in the present specification are merely exemplary or illustrative, and not restrictive. That is, the technology according to an embodiment of the present disclosure can exhibit other effects apparent to those skilled in the art from the description of the present specification, in addition to the effects described above or instead of the effects described above.

Note that the following configurations also fall within the technical scope of the present disclosure.

(1)

A semiconductor device including:

a stack including a semiconductor substrate;

an opening provided extending from a first surface of the stack and filled with an insulating material;

a pad electrode provided at a bottom of the opening;

a wiring layer provided in a planar region of the stack overlapping a planar region where the opening is provided in plan view from the first surface, the wiring layer being electrically connected to the pad electrode; and a through electrode provided in a planar region different from the planar region where the opening is provided in the plan view and provided extending from a second surface of the stack opposite to the first surface.

(2)

The semiconductor device described in (1), in which the stack includes a first substrate adjacent to the first surface and a second substrate adjacent to the second surface, the first substrate and the second substrate being stacked.

(3)

The semiconductor device described in (2), in which the first substrate includes a first semiconductor substrate and a first multilayer wiring layer stacked on the first semiconductor substrate, the second substrate includes a second semiconductor substrate and a second multilayer wiring layer stacked on the second semiconductor substrate, and the first substrate and the second substrate are stacked with the first multilayer wiring layer and the second multilayer wiring layer facing each other.

(4)

The semiconductor device described in (3), in which the pad electrode is provided inside the first multilayer wiring layer or inside the second multilayer wiring layer.

(5)

The semiconductor device described in (3) or (4), in which the first semiconductor substrate includes a photoelectric conversion element that photoelectrically converts light incident on the first surface.

(6)

The semiconductor device described in any one of (3) to (5), further including an electrode bonding structure provided at an interface between the first multilayer wiring layer and the second multilayer wiring layer, the electrode bonding structure bonding metal electrodes exposed at the interface.

(7)

The semiconductor device described in any one of (1) to (6), further including a pixel array unit provided on the first surface of the stack, the pixel array unit including a plurality of pixels two-dimensionally arranged therein.

(8)

The semiconductor device described in (7), in which the pad electrode and the through electrode are provided on an outer periphery of the pixel array unit.

(9)

The semiconductor device described in (8), in which the through electrode is provided in a planar region adjacent to a side of the pad electrode remote from the pixel array unit.

(10)

The semiconductor device described in any one of (1) to (9), further including a transparent substrate stacked over the first surface of the stack.

(11)

The semiconductor device described in (10), in which a gap is formed between the stack and the transparent substrate.

(12)

The semiconductor device described in any one of (1) to (11), in which the pad electrode is provided extending from a planar region overlapping the planar region where the opening is provided to the planar region where the through electrode is provided.

(13)

The semiconductor device described in any one of (1) to (12), in which a probe mark appears on a surface of the pad electrode facing the opening.

(14)

The semiconductor device described in any one of (1) to (13), in which the through electrode is electrically connected to an external connection part through a wiring provided along the second surface.

(15)

The semiconductor device described in any one of (1) to (14), further including a protection element provided in a planar region of the stack overlapping the planar region where the opening is provided in the plan view and electrically connected to the pad electrode.

REFERENCE SIGNS LIST

1, 1A, 1B, 1C, 2, 3, 4, 5, 6 Imaging device
11 First substrate
12 Second substrate
13 Stack
14 Back electrode
15 Color filter
16 On-chip lens
17 Glass sealing resin
18 Transparent substrate
19 Gap
21 Pixel region
22 Control circuit
23 Logic circuit
32 Pixel
33 Pixel array unit
34 Vertical drive circuit
35 Column signal processing circuit
36 Horizontal drive circuit
37 Output circuit
38 Control circuit
39 Input/output terminal
40 Pixel drive line
41 Vertical signal line
42 Horizontal signal line
51 Photoelectric conversion element
52 First transfer transistor
53 Memory section
54 Second transfer transistor
55 FD region
56 Reset transistor
57 Amplification transistor
58 Selection transistor
59 Discharge transistor
61 Opening
62 Pad electrode
63 Buried layer
67 Reinforcing member
71 Wiring-use region
72 Protection element region
81 Second semiconductor substrate
82 Second multilayer wiring layer
85 Through electrode
86 Insulating layer
87 Redistribution layer
88 Through hole
89 Filling layer
101 First semiconductor substrate
102 First multilayer wiring layer
65, 83, 83A, 103 Wiring layer
84, 104 Interlayer insulating film
105 Electrode bonding structure
108 Planarization film
120 Probe
121 Bonding wire
131 Connection region
132 Test region

What is claimed is:

1. A semiconductor device, comprising:
a stack including a semiconductor substrate;
an opening extending from a first surface of the stack and filled with an insulating material;
a pad electrode disposed at a bottom of the opening;
a wiring layer disposed in a first planar region of the stack that overlaps, in a plan view from the first surface, a second planar region where the opening is located, the wiring layer being electrically connected to the pad electrode; and
a through electrode disposed in a third planar region that is laterally spaced from and does not overlap the second planar region in the plan view, the through electrode extending from a second surface of the stack opposite to the first surface.

2. The semiconductor device according to claim 1, wherein the stack includes a first substrate adjacent to the first surface and a second substrate adjacent to the second surface, the first substrate and the second substrate being stacked.

3. The semiconductor device according to claim 2, wherein
the first substrate includes a first semiconductor substrate and a first multilayer wiring layer stacked on the first semiconductor substrate,
the second substrate includes a second semiconductor substrate and a second multilayer wiring layer stacked on the second semiconductor substrate, and
the first substrate and the second substrate are stacked with the first multilayer wiring layer and the second multilayer wiring layer facing each other.

4. The semiconductor device according to claim 3, wherein the pad electrode is disposed inside the first multilayer wiring layer or inside the second multilayer wiring layer.

5. The semiconductor device according to claim 3, wherein the first semiconductor substrate includes a photoelectric conversion element that photoelectrically converts light incident on the first surface.

6. The semiconductor device according to claim 3, further comprising an electrode bonding structure disposed at an interface between the first multilayer wiring layer and the second multilayer wiring layer, the electrode bonding structure bonding metal electrodes exposed at the interface.

7. The semiconductor device according to claim 1, further comprising a pixel array unit disposed on the first surface of the stack, the pixel array unit including a plurality of pixels arranged two-dimensionally.

8. The semiconductor device according to claim 7, wherein the pad electrode and the through electrode are disposed on an outer periphery of the pixel array unit.

9. The semiconductor device according to claim 8, wherein the through electrode is disposed in a planar region adjacent to a side of the pad electrode remote from the pixel array unit.

10. The semiconductor device according to claim 1, further comprising a transparent substrate stacked over the first surface of the stack.

11. The semiconductor device according to claim 10, wherein a gap is formed between the stack and the transparent substrate.

12. The semiconductor device according to claim 1, wherein the pad electrode extends from the second planar region in which the opening is located to the third planar region in which the through electrode is disposed, in the plan view.

13. The semiconductor device according to claim 1, wherein a probe mark is present on a surface of the pad electrode facing the opening.

14. The semiconductor device according to claim 1, wherein the through electrode is electrically connected to an external connection part through a wiring disposed along the second surface.

15. The semiconductor device according to claim 1, further comprising a protection element disposed in the first planar region of the stack overlapping the second planar region in which the opening is located provided in the plan view, the protection element being electrically connected to the pad electrode.

16. The semiconductor device according to claim 1, wherein the through electrode is laterally spaced from and does not overlap the first planar region in the plan view.

17. An electronic apparatus, comprising:

an optical system;

a semiconductor device that receives light from the optical system, the semiconductor device, comprising:

a stack including a semiconductor substrate;

an opening extending from a first surface of the stack and filled with an insulating material;

a pad electrode disposed at a bottom of the opening;

a wiring layer disposed in a first planar region of the stack that overlaps, in a plan view from the first surface, a second planar region where the opening is located, the wiring layer being electrically connected to the pad electrode; and a through electrode disposed in a third planar region that is laterally spaced from and does not overlap the second planar region in the plan view, the through electrode extending from a second surface of the stack opposite to the first surface; and a digital signal processor that processes signals received from the semiconductor device.

18. The electronic apparatus according to claim 17, wherein the through electrode is laterally spaced from and does not overlap the first planar region in the plan view.

19. The electronic apparatus according to claim 17, wherein the stack includes a first substrate adjacent to the first surface and a second substrate adjacent to the second surface, the first substrate and the second substrate being stacked.

20. The electronic apparatus according to claim 19, wherein the first substrate includes a first semiconductor substrate and a first multilayer wiring layer stacked on the first semiconductor substrate, the second substrate includes a second semiconductor substrate and a second multilayer wiring layer stacked on the second semiconductor substrate, and the first substrate and the second substrate are stacked with the first multilayer wiring layer and the second multilayer wiring layer facing each other.

* * * * *